US007960328B2

(12) United States Patent
Visintin et al.

(10) Patent No.: US 7,960,328 B2
(45) Date of Patent: Jun. 14, 2011

(54) COMPOSITION AND METHOD FOR RECYCLING SEMICONDUCTOR WAFERS HAVING LOW-K DIELECTRIC MATERIALS THEREON

(75) Inventors: Pamela M. Visintin, North Charleston, SC (US); Ping Jiang, Danbury, CT (US); Michael B. Korzenski, Danbury, CT (US); Mackenzie King, Southbury, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 114 days.

(21) Appl. No.: 12/093,290

(22) PCT Filed: Nov. 9, 2006

(86) PCT No.: PCT/US2006/060696
§ 371 (c)(1),
(2), (4) Date: May 9, 2008

(87) PCT Pub. No.: WO2007/111694
PCT Pub. Date: Oct. 4, 2007

(65) Prior Publication Data
US 2008/0261847 A1    Oct. 23, 2008

Related U.S. Application Data

(60) Provisional application No. 60/735,225, filed on Nov. 9, 2005, provisional application No. 60/760,969, filed on Jan. 20, 2006, provisional application No. 60/805,826, filed on Jun. 26, 2006, provisional application No. 60/821,631, filed on Aug. 7, 2006.

(51) Int. Cl.
*C11D 7/32* (2006.01)

(52) U.S. Cl. ............... 510/175; 252/79.1; 134/1.3
(58) Field of Classification Search ................. 510/175; 252/79.1; 134/1.3
See application file for complete search history.

(56) References Cited

U.S. PATENT DOCUMENTS

| 3,559,281 A | | 2/1971 | Mayberry et al. |
| 3,923,567 A | | 12/1975 | Lawrence |
| 4,032,621 A | * | 6/1977 | Meadows ............. 423/488 |
| 4,101,425 A | * | 7/1978 | Young et al. ............. 507/260 |

(Continued)

FOREIGN PATENT DOCUMENTS

JP    11067632 A    3/1999

(Continued)

OTHER PUBLICATIONS

European Patent Office, Supplemental European Search Report, Jan. 22, 2009.

*Primary Examiner* — Gregory E Webb
(74) *Attorney, Agent, or Firm* — Tristan A. Fuierer; Moore & Van Allen, PLLC; Chih-Sheng Lin

(57) ABSTRACT

A removal composition and process for removing low-k dielectric material, etch stop material, and/or metal stack material from a rejected microelectronic device structure having same thereon. The removal composition includes hydrofluoric acid. The composition achieves at least partial removal of the material(s) from the surface of the microelectronic device structure having same thereon, for recycling and/or reuse of said structure, without damage to the underlying polysilicon or bare silicon layer employed in the semiconductor architecture.

23 Claims, 3 Drawing Sheets

U.S. PATENT DOCUMENTS

| | | | |
|---|---|---|---|
| 5,320,709 A | 6/1994 | Bowden et al. | |
| 5,622,875 A | 4/1997 | Lawrence | |
| 5,705,089 A * | 1/1998 | Sugihara et al. | 252/79.1 |
| 5,792,274 A | 8/1998 | Tanabe et al. | |
| 5,855,735 A | 1/1999 | Takada et al. | |
| 5,962,385 A | 10/1999 | Maruyama et al. | |
| 5,968,848 A | 10/1999 | Tanabe et al. | |
| 5,981,454 A | 11/1999 | Small | |
| 5,981,484 A | 11/1999 | Davidson | |
| 6,140,211 A | 10/2000 | Nanda et al. | |
| 6,191,085 B1 | 2/2001 | Cooper et al. | |
| 6,235,693 B1 | 5/2001 | Cheng et al. | |
| 6,284,628 B1 | 9/2001 | Kuwahara et al. | |
| 6,406,923 B1 | 6/2002 | Inoue et al. | |
| 6,547,647 B2 | 4/2003 | Chang | |
| 6,554,912 B2 | 4/2003 | Sahbari | |
| 6,627,587 B2 | 9/2003 | Naghshineh et al. | |
| 6,693,047 B1 | 2/2004 | Lu et al. | |
| 6,706,636 B2 | 3/2004 | Matsukawa | |
| 6,761,625 B1 | 7/2004 | Rojhantalab et al. | |
| 6,762,132 B1 | 7/2004 | Yates | |
| 6,770,426 B1 | 8/2004 | Vaartstra | |
| 6,773,873 B2 | 8/2004 | Seijo et al. | |
| 6,831,048 B2 | 12/2004 | Kezuka et al. | |
| 6,849,200 B2 | 2/2005 | Baum et al. | |
| 6,869,921 B2 | 3/2005 | Koito et al. | |
| 7,056,648 B2 | 6/2006 | Cooper et al. | |
| 7,119,052 B2 | 10/2006 | Korzenski et al. | |
| 7,208,325 B2 | 4/2007 | Wang et al. | |
| 7,250,391 B2 | 7/2007 | Kanno et al. | |
| 7,300,601 B2 | 11/2007 | Liu et al. | |
| 7,419,911 B2 | 9/2008 | Chelle et al. | |
| 7,419,945 B2 | 9/2008 | Hsu | |
| 7,456,140 B2 | 11/2008 | Small et al. | |
| 2002/0119245 A1 | 8/2002 | Verhaverbeke | |
| 2002/0127859 A1 | 9/2002 | Wu | |
| 2003/0027430 A1 | 2/2003 | Stevens et al. | |
| 2004/0009883 A1 | 1/2004 | Ikemoto et al. | |
| 2004/0029753 A1 * | 2/2004 | Ikemoto et al. | 510/175 |
| 2004/0050406 A1 | 3/2004 | Sehgal | |
| 2004/0180300 A1 | 9/2004 | Minsek et al. | |
| 2004/0229461 A1 | 11/2004 | Darsillo et al. | |
| 2005/0084792 A1 | 4/2005 | Yokoi et al. | |
| 2005/0183740 A1 | 8/2005 | Fulton et al. | |
| 2005/0197265 A1 | 9/2005 | Rath et al. | |
| 2005/0205515 A1 | 9/2005 | Saga et al. | |
| 2006/0009011 A1 | 1/2006 | Barrett et al. | |
| 2006/0063687 A1 | 3/2006 | Minsek et al. | |
| 2006/0138399 A1 * | 6/2006 | Itano et al. | 257/40 |
| 2006/0154186 A1 | 7/2006 | Minsek et al. | |
| 2006/0154484 A1 | 7/2006 | Hwang et al. | |
| 2006/0166847 A1 | 7/2006 | Walker et al. | |
| 2006/0199749 A1 | 9/2006 | Suzuki et al. | |
| 2006/0249482 A1 | 11/2006 | Wrschka et al. | |
| 2007/0082497 A1 | 4/2007 | Lee et al. | |
| 2007/0087580 A1 | 4/2007 | Kang et al. | |
| 2008/0006305 A1 | 1/2008 | Bernhard et al. | |
| 2008/0124930 A1 | 5/2008 | Lim et al. | |
| 2008/0125342 A1 | 5/2008 | Visintin et al. | |
| 2008/0318426 A1 | 12/2008 | Kim et al. | |

FOREIGN PATENT DOCUMENTS

| | | |
|---|---|---|
| WO | 0071782 A1 | 11/2000 |
| WO | 2005019499 A1 | 3/2005 |
| WO | WO2006023061 A1 | 3/2006 |
| WO | 2006074316 A1 | 7/2006 |
| WO | 2006110645 A2 | 10/2006 |
| WO | 2006113222 A2 | 10/2006 |
| WO | 2006113621 A2 | 10/2006 |
| WO | 2006127885 A1 | 11/2006 |
| WO | 2006133253 A1 | 12/2006 |
| WO | 2006138235 A2 | 12/2006 |
| WO | 2007044446 A1 | 4/2007 |
| WO | 2007044447 A2 | 4/2007 |
| WO | 2007047365 A2 | 4/2007 |
| WO | 2008039730 A1 | 4/2008 |

* cited by examiner

COMPOSITION AND METHOD FOR RECYCLING SEMICONDUCTOR WAFERS HAVING LOW-K DIELECTRIC MATERIALS THEREON

CROSS-REFERENCE TO RELATED APPLICATIONS

This application is filed under the provisions of 35 U.S.C. §371 and claims the priority of International Patent Application No. PCT/US2006/060696 filed on 9 Nov. 2006, which claims priority to U.S. Provisional Patent Application No. 60/735,225 filed on 9 Nov. 2005, U.S. Provisional Patent Application No. 60/760,969 filed on 20 Jan. 2006, U.S. Provisional Patent Application No. 60/805,826 filed on 26 Jun. 2006, and U.S. Provisional Patent Application No. 60/821,631 filed on 7 Aug. 2006, which are all hereby incorporated herein by reference in their entireties.

FIELD OF THE INVENTION

The present invention relates to compositions and processes useful for the removal of low-k dielectric and other material layers from a rejected substrate or article having said material deposited thereon, for recycling/reworking and/or reuse of said substrate or article, and to products manufactured using same.

DESCRIPTION OF THE RELATED ART

The escalating requirements for performance associated with high density, ultra large scale integration (ULSI) semiconductor wiring have increasingly required the use of low dielectric constant (low-k) insulating layers to increase signal transport speeds as device sizes have decreased.

Typical low-k materials include carbon doped oxides (CDO) deposited using commercially available precursors such as SiLK™, AURORA™, CORAL™, or BLACK DIAMOND™, for example using the proprietary BLACK DIAMOND™ process. Such CDO's are typically formed using chemical vapor deposition (CVD) processes from organosilane and organosiloxane precursors. CVD carbon doped oxide low-k dielectrics typically consist of a porous, low density material having an overall dielectric constant less than about 3.2 and are used in a variety of semiconductor structures, typically by forming multiple layers of the CDO's within which other semiconductor structures, such as metal interconnect lines and vias, are formed. For example, CDO's may be used as dielectric insulating layers (inter-metal dielectric (IMD) layers), capping layers and/or as gap filling material for certain structures.

Frequently, a microelectronic device wafer, for example a silicon semiconductor wafer, must be scrapped and hopefully recycled following the unacceptable processing of layers during the multi-layer device manufacturing process or qualification processes. Any number of processing problems may occur, for example, the non-uniform deposition of the CDO layer or a subsequent etching error. A number of quality control testing methods are performed following selected processing steps whereby the acceptability of the semiconductor wafer may be rejected and "scrapped" for various reasons resulting in a significant non-productive cost.

The prior art practice has been to send the rejected or scrapped process wafers to wafer suppliers for processing, whereby the dielectric layers, such as CDO layers, are removed from the semiconductor wafer using chemical and mechanical methods for reuse of said wafer. Following the successful removal of dielectric layers and other features overlying the wafer, the wafer is recycled or reused in a new multi-layer semiconductor device manufacturing process. As semiconductor wafer manufacturing moves to larger diameter wafers, for example 12 inch wafers, scrapping and recycling a process wafer off-site becomes increasingly more unattractive because of the high non-productive cost.

There is a need in the art to develop a process whereby low-k dielectric layers, including CDO layers, may be removed from rejected microelectronic devices, e.g., semiconductor wafers, in-house using improved compositions, said compositions being compatible with existing manufacturing processes. Preferably, the process of using said compositions to remove low-k dielectric layers from the rejected microelectronic devices does not require a high energy-consuming oxidizing step.

Towards that end, it is an object of the present invention to provide an improved composition and process whereby metal stack materials, etch stop layers, and/or low-k dielectric layers, including CDO layers, may be removed from rejected microelectronic device structures for in-house recycling of said structures, whereby the compositions and processes are compatible with existing manufacturing processes and components. Importantly, the underlying device surface, e.g., silicon, is preferably undamaged by said removal composition.

In addition to the removal of the metal stack materials, etch stop layers, and/or low-k dielectric layers while concurrently minimizing the damage to the underlying substrate material, the composition of the invention may be formulated to comply with local environmental requirements. For example, high fluoride concentrations and high organic solvent concentrations may make a composition difficult to use in high volume manufacturing due to wastewater disposal issues. Depending on the level of chemical oxygen demand (COD) of the formulation, whereby the COD of a solution is a measure of the amount of organic compounds that can be fully oxidized to carbon dioxide in the presence of a strong oxidant under acidic conditions, the formulation may not be allowed in the facility wastewater for direct return to the environment. For example, in Switzerland, the COD of a wastewater sample must be reduced to between 200 and 1000 mg/L before wastewater or industrial water can be returned to the environment (Pupunat, L., Sollberger, F., Rychen, P., "Efficient Reduction of Chemical Oxygen Demand in Industrial Wastewaters," http://www.csem.ch/corporate/Report2002/pdf/p56.pdf).

If the wastewater contains only fluoride sources (without organic solvent), a fluoride treatment system may be employed to remove the fluoride from wastewater first, and then the water may be discharged to the environment. If the wastewater contains only organic solvent(s) (without fluoride source), an organic disposal system, such as an incinerator, may be employed. Disadvantageously, incineration systems may not accept wastewater samples containing high fluoride concentrations because the fluoride source may damage the incinerator materials of construction.

Accordingly, in addition to providing an improved composition and process for the removal of low-k dielectric and other material layers from rejected microelectronic device structures for in-house recycling of said structures, the composition and/or process of using said composition preferably complies with local regulatory standards associated with the disposal of said composition.

SUMMARY OF THE INVENTION

The present invention relates to compositions and processes useful for the removal of low-k dielectric and other material layers, including carbon doped oxide material layers, from a rejected microelectronic device structure having said material deposited thereon, for recycling and/or reuse of said microelectronic device structure, and methods of using such compositions and products or intermediate products manufactured using the same.

In one aspect, the present invention relates to removal compositions useful in removing material selected from the group consisting of low-k dielectric material, etch stop material, metal stack material, and combinations thereof from the surface of a rejected microelectronic device structure for recycling of said microelectronic device structure, and methods of making and using the same. The compositions of the present invention include hydrofluoric acid.

In another aspect, the present invention relates to a removal composition, comprising hydrofluoric acid and water, wherein said composition is further characterized by comprising at least one of the following components (I) and (II):
(I) at least one amine; or
(II) at least one organic solvent, wherein the composition is substantially devoid of amine species, and
wherein said removal composition is suitable for removing material selected from the group consisting of low-k dielectric material, etch stop material, metal stack material, and combinations thereof from a microelectronic device having said material thereon.

In still another aspect, the present invention relates to a removal composition comprising hydrofluoric acid, amine-N-oxide, and water, wherein said removal composition is suitable for removing material selected from the group consisting of low-k dielectric material, metal stack material, and combinations thereof from a microelectronic device having said material thereon.

In still another aspect, the present invention relates to a removal composition comprising hydrofluoric acid, N-methylmorpholine-N-oxide, and water, wherein said removal composition is suitable for removing material selected from the group consisting of low-k dielectric material, metal stack material, and combinations thereof from a microelectronic device having said material thereon.

In a further aspect, the present invention relates to a removal composition comprising hydrofluoric acid, water, at least one sulfur-containing solvent, and at least one glycol ether, wherein said composition is substantially devoid of amine, and wherein said removal composition is suitable for removing material selected from the group consisting of low-k dielectric material, etch stop material, metal stack material, and combinations thereof from a microelectronic device having said material thereon.

In a further aspect, the present invention relates to a removal composition comprising hydrofluoric acid, water, tetramethylene sulfone, and at least one glycol ether, wherein said composition is substantially devoid of amine, and wherein said removal composition is suitable for removing material selected from the group consisting of low-k dielectric material, etch stop material, metal stack material, and combinations thereof from a microelectronic device having said material thereon. Preferably, the at least one glycol ether comprises diethylene glycol butyl ether and the amount of water is in a range from about 10 wt % to 80 wt %, based on the total weight of the composition.

Still another aspect relates to a stable removal composition, comprising hydrofluoric acid, at least one organic solvent, at least one oxidizing agent, at least one chelating agent, and water, wherein the composition is devoid of amines, and wherein said removal composition is temporally stable and suitable for removing material selected from the group consisting of low-k dielectric material, etch stop material, metal stack material, and combinations thereof from a microelectronic device having said material thereon. Preferably, the chelating agent comprises CDTA.

Another aspect of the invention relates to a kit comprising, in one or more containers, one or more of the following reagents for forming a removal composition, wherein said removal composition comprises hydrofluoric acid and water, wherein said composition is further characterized by comprising at least one of the following components (I)-(II):
(I) at least one amine; or
(II) at least one organic solvent, wherein the composition is substantially devoid of amine species,
and wherein the kit is adapted to form a removal composition suitable for removing material selected from the group consisting of low-k dielectric material, etch stop material, metal stack material, and combinations thereof from a microelectronic device having said material thereon.

In another aspect, the invention relates to a method of removing material from a microelectronic device having said material thereon, said method comprising contacting a microelectronic device structure with a removal composition for sufficient time to at least partially remove material selected from the group consisting of low-k dielectric material, etch stop material, metal stack material, and combinations thereof, from the microelectronic device structure, wherein the removal composition includes hydrofluoric acid and water, and wherein said composition is further characterized by comprising at least one of the following components (I)-(II):
(I) at least one amine; or
(II) at least one organic solvent, wherein the composition is substantially devoid of amine species.

In a further aspect, the present invention relates to a method of manufacturing a microelectronic device, said method comprising contacting a microelectronic device structure with a removal composition for sufficient time to at least partially remove material selected from the group consisting of low-k dielectric material, etch stop material, metal stack material, and combinations thereof from the microelectronic device structure having said material thereon, wherein the removal composition includes hydrofluoric acid and water, and wherein said composition is further characterized by comprising at least one of the following components (I)-(II):
(I) at least one amine; or
(II) at least one organic solvent, wherein the composition is substantially devoid of amine species.
Preferably, the contacted microelectronic device structure is subsequently processed to manufacture a multi-layer device structure and said device structure is incorporated into the microelectronic device.

A further aspect of the invention relates to microelectronic device wafers reclaimed using the methods of the invention comprising contacting the rejected microelectronic device wafer with a removal composition for sufficient time to at least partially remove material selected from the group consisting of low-k dielectric material, etch stop material, metal stack material, and combinations thereof from the microelectronic device, using the methods and/or compositions described herein, and optionally, incorporating the microelectronic device structure into a product (e.g., microelectronic device).

Yet another aspect of the invention relates to improved microelectronic devices and microelectronic device structures, and products incorporating same, made using the methods of the invention comprising contacting the microelectronic device structure with a removal composition for sufficient time to at least partially remove material selected from the group consisting of low-k dielectric material, etch stop material, metal stack material, and combinations thereof from the microelectronic device, using the methods and/or compositions described herein, and optionally, incorporating the microelectronic device structure into a product (e.g., microelectronic device).

Another aspect of the invention relates to a method of removing low-k dielectric material from a microelectronic device having said low-k dielectric material thereon, said method comprising:

contacting the microelectronic device with a removal composition for sufficient time to at least partially remove said low-k dielectric material from the microelectronic device, wherein the removal composition includes hydrofluoric acid and water, and wherein the pH of a 20:1 dilution of the removal composition in water is in a range from about 2.5 to about 4.5;

contacting the microelectronic device having removal composition thereon with a neutralizing composition to neutralize the removal composition on the microelectronic device; and rinsing the microelectronic device having neutralized removal composition thereon with water to remove the neutralized removal composition therefrom.

Still another aspect of the invention relates to a method of recycling a microelectronic device substrate, said method comprising:

contacting a microelectronic device structure comprising material selected from the group consisting of low-k dielectric material, etch stop material, metal stack material, and combinations thereof with a removal composition for sufficient time to at least partially remove said material from the microelectronic device structure to produce a recycled microelectronic device structure; and applying at least one layer of low-k dielectric material on the recycled microelectronic device structure, wherein the removal composition includes hydrofluoric acid and water, and wherein said composition is further characterized by comprising at least one of the following components (I)-(II):

(I) at least one amine; or (II) at least one organic solvent, wherein the composition is substantially devoid of amine species.

Yet another aspect of the invention relates to a microelectronic device comprising a microelectronic device wafer and at least one layer thereon, wherein said at least one layer is selected from the group consisting of low-k dielectric material, barrier layer material, metals, metal alloys, and etch stop layers, and wherein the microelectronic device wafer is reclaimed. Preferably, the microelectronic device wafer comprises silicon and the reclaimed wafer has a thickness that is greater than 95% of the thickness of a new wafer, more preferably greater than 98%, and most preferably greater than 99% of the thickness of a new wafer.

Another aspect of the invention relates to an article of manufacture comprising a removal composition of the invention, a microelectronic device, and material selected from the group consisting of low-k dielectric material, etch stop material, metal stack material, and combinations thereof, wherein the removal composition includes hydrofluoric acid and water, and wherein said composition is further characterized by comprising at least one of the following components (I)-(II):

(I) at least one amine; or (II) at least one organic solvent, wherein the composition is substantially devoid of amine species.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
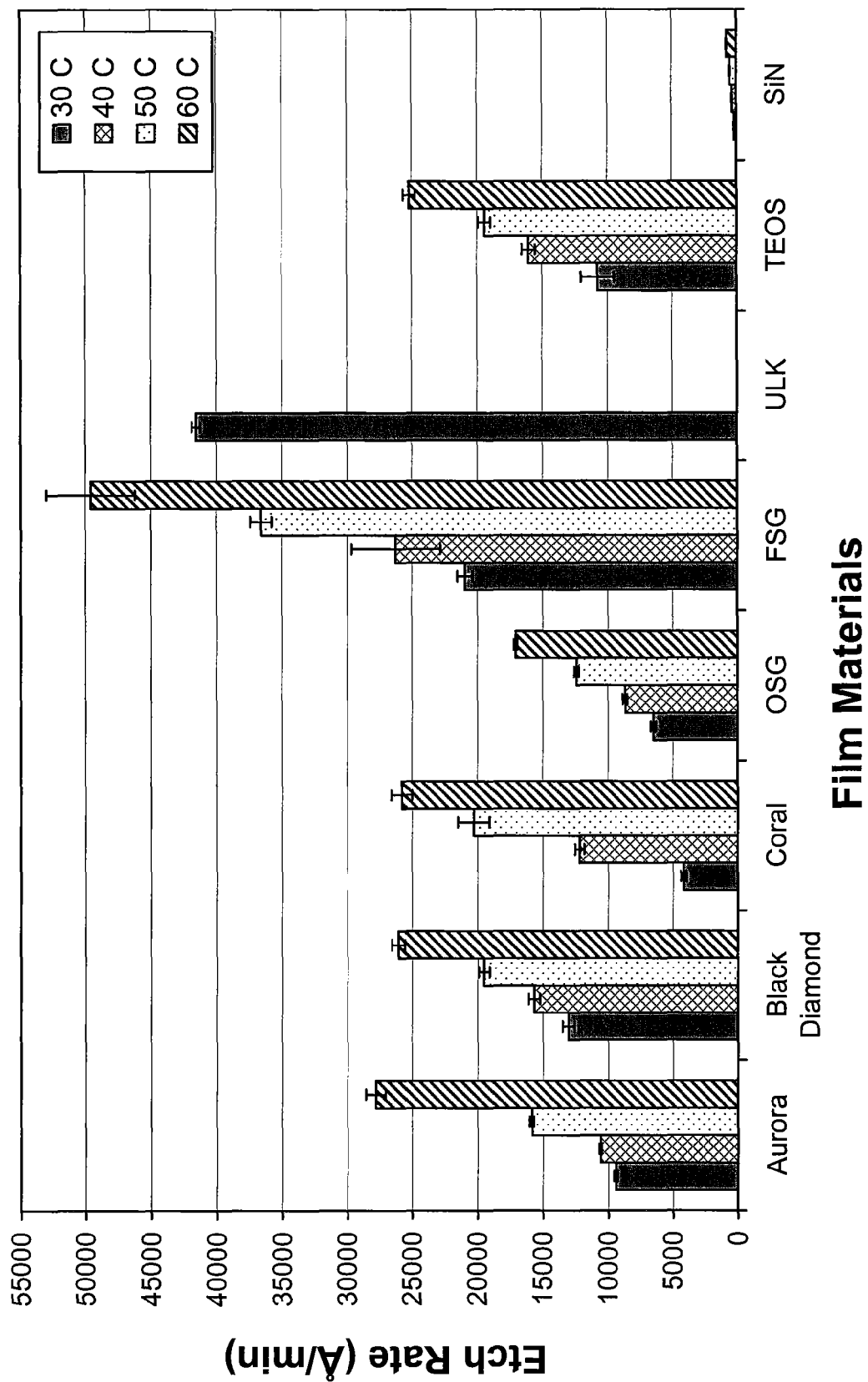
FIG. 1 is a plot of the etch rate, in Å min$^{-1}$, of various low-k dielectric materials as a function of temperature.

The present invention relates to removal compositions and processes useful for the removal of low-k dielectric and other material layers, including carbon doped oxide material, from a rejected microelectronic device structure having said material thereon, for in-house recycling of said microelectronic device structure.

"Microelectronic device" corresponds to semiconductor substrates, flat panel displays, and microelectromechanical systems (MEMS), manufactured for use in microelectronic, integrated circuit, or computer chip applications. It is to be understood that the term "microelectronic device" and "microelectronic device structure" is not meant to be limiting in any way and includes any substrate or structure that will eventually become a microelectronic device or microelectronic assembly.

As used herein, "about" is intended to correspond to ±5% of the stated value.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), and carbon-doped oxide (CDO) glass. For purposes of this invention, low-k dielectric material further includes silicon nitride materials. It is to be appreciated that the low-k dielectric materials may have varying densities and varying porosities.

As used herein, the term "semi-aqueous" refers to a mixture of water and organic components. Semi-aqueous removal compositions must not damage the material located adjacent to the low-k dielectric material removed using said composition. Adjacent materials include bare silicon, polysilicon, and combinations thereof. Depending on the desired results, adjacent materials may also include etch stop-layers and metal stack materials. Preferably, less than 100 Å of adjacent materials are removed, more preferably less than 50 Å, even more preferably less than 20 Å, even more preferably less than 10 Å and most preferred less than 1 Å of the adjacent materials are removed using the compositions of the invention). Preferably, at least 95% of the low-k dielectric is removed, more preferably at least 99%, even more preferably at least 99.9%, and most preferably 100%. It should be appreciated that there will be occasions when it is desired to remove metal stack materials and/or etch stop layers, in addition to low-k dielectric materials, in the process of regenerating the rejected microelectronic device structure.

As defined herein, "metal stack materials" correspond to: tantalum, tantalum nitride, titanium nitride, titanium, nickel, cobalt, tungsten, and silicides thereof; copper layers; aluminum layers; Al/Cu layers; alloys of Al; alloys of Cu; hafnium oxides; hafnium oxysilicates; zirconium oxides; lanthanide oxides; titanates; and combinations thereof on the microelectronic device. It is to be appreciated by one skilled in the art that although the compositions of the invention are described as removing low-k dielectric materials, the recitation that the compositions are useful for removing low-k dielectric materials is intended to include the removal of metal stack materials as well, when desired.

As defined herein, "etch stop layers" include silicon carbide (SiC), silicon carbon nitride (SiCN), silicon carbon oxide (SiCO), silicon oxynitride (SiON), copper, silicon germanium (SiGe), SiGeB, SiGeC, AlAs, InGaP, InP, InGaAs, and combinations thereof. It is to be appreciated by one skilled in the art that although the compositions of the invention are described as removing low-k dielectric materials, the recitation that the compositions are useful for removing etch stop layers is intended to include the removal of metal stack materials as well, when desired.

The requirements of a successful wafer reclamation include, but are not limited to, zero or negligible front-side, bevel edge, and/or backside silicon pitting, less than 50 particles at 0.12 µm, a total thickness variation (TTV) of less than about 5 µm, and/or a surface metal contamination of less than $1 \times 10^{10}$ atoms cm$^{-2}$. Bevel edge and backside cleaning is used to remove photoresist and electroplated copper from the outermost edge and backside of the device wafer, which reduces particle and metal contamination during subsequent processing. As defined herein, "total thickness variation" corresponds to the absolute difference between the maximum and the minimum thickness of a microelectronic device wafer as determined using a thickness scan or series of point thickness measurements known in the art.

It is to be understood that the microelectronic device structure to be reclaimed includes a wafer comprising bare silicon, poly-silicon, and combinations thereof, and can be any diameter or thickness conventionally used in the art.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In one aspect, the present invention relates to removal compositions useful in removing low-k dielectric and metal stack material from the surface of a rejected microelectronic device structure for recycling of said microelectronic device structure, and methods of making and using the same. The compositions of the present invention include hydrofluoric acid.

In one embodiment of this aspect of the invention, the compositions include at least one amine species, hydrofluoric acid, optionally at least one organic solvent, optionally at least one additional acid species, optionally at least one chelating agent, and optionally water, present in the following ranges, based on the total weight of the composition:

| component | % by weight |
|---|---|
| amine(s) | about 1% to about 70.0% |
| hydrofluoric acid | about 1% to about 70.0% |
| optional organic solvent(s) | 0 to about 80.0% |
| optional additional acid(s) | 0 to about 80% |
| optional chelating agent(s) | 0 to about 10% |
| optional water | 0 to about 50% |

In the broad practice of the invention, the removal composition may comprise, consist of, or consist essentially of at least one amine species, hydrofluoric acid, optionally at least one organic solvent, optionally at least one additional acid species, optionally at least one chelating agent, and optionally water. In general, the specific proportions and amounts of amine(s), hydrofluoric acid source(s), optional organic solvent(s), optional additional acid(s), optional chelating agent(s), and water, in relation to each other, may be suitably varied to provide the desired removal action of the composition for the low-k dielectric material and/or processing equipment, as readily determinable within the skill of the art without undue effort.

Compositions of the invention have a pH value in a range from about 1 to about 7, more preferably about 2.5 to about 4.5, most preferably about 3 to about 3.5, when diluted 20:1 with deionized water.

The amine species may include, but are not limited to, straight-chained or branched $C_1$-$C_{20}$ alkylamines, substituted or unsubstituted $C_6$-$C_{10}$ arylamines, glycolamines, alkanolamines, and amine-N-oxides including, but not limited to, pyridine; 2-ethylpyridine; 2-methoxypyridine and derivatives thereof such as 3-methoxypyridine; 2-picoline; pyridine derivatives; dimethylpyridine; piperidine; piperazine; triethylamine; triethanolamine; ethylamine; methylamine; isobutylamine; tert-butylamine; tributylamine; dipropylamine; dimethylamine; diglycol amine; monoethanolamine; pyrrole; isoxazole; 1,2,4-triazole; bipyridine; pyrimidine; pyrazine; pyridazine; quinoline; isoquinoline; indole; imidazole; N-methylmorpholine-N-oxide (NMMO); trimethylamine-N-oxide; triethylamine-N-oxide; pyridine-N-oxide; N-ethylmorpholine-N-oxide; N-methylpyrrolidine-N-oxide; N-ethylpyrrolidine-N-oxide; 1-methylimidazole; diisopropylamine; diisobutylamine; aniline; aniline derivatives; and combinations thereof. Preferably, the amine species comprises isoxazole, TAZ, or combinations thereof.

Alternatively, the amine species may comprise a combined amine-hydrogen fluoride salt. Accordingly, the removal compositions of the present invention may include at least one amine-hydrogen fluoride salt, optionally at least one organic solvent, optionally at least one organic acid, optionally at least one chelating agent, and optionally water. Amine-hydrogen fluoride salts are non-volatile and as such, changes in the solution pH due to evaporation of the amine species is avoided. Amine-hydrogen fluoride salts contemplated herein include, but are not limited to, any of the above-enumerated amines in combination with HF to form an amine-hydrogen fluoride salt. Preferably, the amine-hydrogen fluoride salt species, when used, comprises isoxazole:HF and/or NMMO:HF. It is to be appreciated that the ratio of amine:hydrogen fluoride salt may vary from about 1:1 to about 20:1 depending on the conditions of the reaction and the nature of the low-k dielectric material to be removed.

Water may be included in the compositions of the invention in part because of its ability to solubilize the fluoride species. Preferably, the water is deionized.

The organic solvent(s), when present, serve as a solvent, assist in the penetration and dissolution of organic residues, wet the surface of the microelectronic device structure to facilitate low-k dielectric removal and/or passivate the underlying adjacent materials (e.g., bare silicon, polysilicon, silicon carbide, silicon carbon nitride, and silicon carbon oxide). Organic solvents contemplated herein include, but are not limited to, alcohols, ethers, pyrrolidinones, glycols, carboxylic acids, and glycol ethers such as methanol, ethanol, isopropanol, butanol, and higher alcohols (including diols, triols, etc.), 2,2,3,3,4,4,5,5-octafluoro-1-pentanol, 1H,1H,9H-perfluoro-1-nonanol, perfluoroheptanoic acid, 1H,1H,7H-dodecafluoro-1-heptanol, perfluoropentanoic acid, 1H,1H,8H,8H-dodecafluoro-1,8-octanediol, 2,2,3,3,4,4,5,5-octafluoro-1,6-hexanediol, 5H-perfluoropentanoic acid, n-butyl heptafluorobutyrate, tetrahydrofuran (THF), N-methylpyrrolidinone (NMP), cyclohexylpyrrolidinone, N-octylpyrrolidinone, N-phenylpyrrolidinone, methyl formate, dimethyl formamide (DMF), dimethylsulfoxide (DMSO), tetramethylene sulfone (sulfolane), diethyl ether, phenoxy-2-propanol (PPh), propriopheneone, ethyl lactate, ethyl acetate, ethyl benzoate, acetonitrile, acetone, ethylene glycol, propylene glycol, dioxane, butyryl lactone, butylene carbonate, ethylene carbonate, propylene carbonate, dipropylene glycol, amphiphilic species (diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether, tripropylene glycol methyl ether, dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof), branched fluorinated or non-fluorinated ether-linkage carboxylic acids $(CH_3CH_2)_nO(CH_2)_mCOOH$, where n=1 to 10 and m=1 to 10), unbranched fluorinated or non-fluorinated ether-linkage carboxylic acids $(CH_3CH_2)_nO(CH_2)_mCOOH$, where n=1 to 10 and m=1 to 10), branched fluorinated or non-fluorinated non-ether linkage carboxylic acids $(CH_3(CH_2)_nCOOH$, where n=1 to 10), unbranched fluorinated or non-fluorinated non-ether linkage carboxylic acids $(CH_3(CH_2)_nCOOH$, where n=1 to 10), dicarboxylic acids, tricarboxylic acids, and combinations thereof. In addition, the solvent may comprise other amphiphilic species, i.e., species that contain both hydrophilic and hydrophobic moieties similar to surfactants. Hydrophobic properties may generally be imparted by inclusion of a molecular group consisting of hydrocarbon or fluorocarbon groups and the hydrophilic properties may generally be imparted by inclusion of either ionic or uncharged polar functional groups. Preferably, the organic solvent comprises sulfolane, butyl carbitol, dipropylene glycol propyl ether, or mixtures thereof.

The optional additional acid(s) assist in breaking up and solubilizing the cross-linked polymer bonds in the low-k dielectric material. Additional acids contemplated herein include, but are not limited to, boric acid, oxalic acid, succinic acid, citric acid, lactic acid, acetic acid, trifluoroacetic acid, tetrafluoroboric acid, hydrofluoric acid, hydrochloric acid, formic acid, fumaric acid, acrylic acid, malonic acid, maleic acid, malic acid, L-tartaric acid, methyl sulfonic acid, trifluoromethanesulfonic acid, iodic acid, mercaptoacetic acid, thioacetic acid, glycolic acid, sulfuric acid, nitric acid, propynoic acid, pyruvic acid, acetoacetic acid, and combinations thereof.

Chelating agent(s) may be added to reduce or eliminate metal contaminating species on the surface of the device during wafer reclamation. Chelating agent(s) contemplated herein include, but are not limited to: β-diketonate compounds such as acetylacetonate, 1,1,1-trifluoro-2,4-pentanedione, and 1,1,1,5,5,5-hexafluoro-2,4-pentanedione; carboxylates such as formate and acetate and other long chain carboxylates; and amides (and amines), such as bis(trimethylsilylamide) tetramer. Additional chelating agents include amines and amino acids (i.e. glycine, alanine, citric acid, acetic acid, maleic acid, oxalic acid, malonic acid, succinic acid, nitrilotriacetic acid, iminodiacetic acid, etidronic acid, ethylenediamine, ethylenediaminetetraacetic acid (EDTA), and (1,2-cyclohexylenedinitrilo)tetraacetic acid (CDTA), and monoethanolamine (MEA)). Unlike non-fluorinated beta-diketones, which may need to be combined with a base to form a deprotonated compound capable of chelation, fluorinated beta-diketone chelating agents can be used in the absence of a base. The chelating agent may be introduced to the composition at the manufacturer, prior to introduction of the composition to the device wafer, or alternatively at the device wafer, i.e., in situ. It is further contemplated that in addition to chelating agent(s), other components may be added to the composition to dilute, maintain and/or increase the concentration of other components in the composition.

Such compositions may optionally include additional components, including active as well as inactive ingredients, e.g., surfactants, stabilizers, passivators, dispersants, pH stabilizing agents, oxidants, etc.

Specific embodiments of this aspect of the removal composition may be in concentrated form and include the following, wherein the components may be present in the following ranges, based on the total weight of the composition:

| component | % by weight | preferred/% by weight |
|---|---|---|
| amine(s) | about 1% to about 30.0% | about 5% to about 15.0% |
| hydrofluoric acid | about 5% to about 45.0% | about 15% to about 25.0% |
| organic solvent(s) | about 10% to about 60% | about 20% to about 50% |
| additional acid(s) | about 5% to about 25% | about 10% to about 25% |
| water | about 10% to about 60% | about 15% to about 30% |
| or | | |
| amine-hydrogen fluoride salt | about 1% to about 40.0% | about 5% to about 30.0% |
| hydrofluoric acid | about 0.01% to about 5.0% | about 1% to about 2% |
| organic solvent(s) | about 40% to about 75% | about 50% to about 70% |
| additional acid(s) | about 1% to about 20% | about 5% to about 20% |
| water | about 0.01% to about 20% | about 1% to about 20% |
| or | | |

-continued

| component | % by weight | preferred/% by weight |
|---|---|---|
| amine-hydrogen fluoride salt | about 1% to about 40.0% | about 30% to about 35.0% |
| hydrofluoric acid | about 0.01% to about 5.0% | about 1% to about 2% |
| organic solvent(s) | about 45% to about 75% | about 55% to about 70% |
| water | about 0.01% to about 10% | about 1% to about 2% |
| or | | |
| amine | about 1% to about 40% | about 15% to about 25% |
| hydrofluoric acid | about 5% to about 50% | about 35% to about 45% |
| water | about 20% to about 80% | about 35% to about 45% |
| or | | |
| amine | about 1% to about 30.0% | about 5% to about 20% |
| hydrofluoric acid | about 5% to about 50% | about 10% to about 30% |
| organic solvent(s) | about 1% to about 80% | about 10% to about 65% |
| water | about 1% to about 80% | about 15% to about 70% | and the pH of a 20:1 dilution of the semi-aqueous amine-containing removal composition in deionized water is in a range from about 2.5 to about 4.5. Preferably, the semi-aqueous amine-containing removal composition contains less than 30 wt. %, preferably less than 10 wt %, more preferably less than 2 wt %, even more preferably less than 1 wt % and most preferred is devoid of tetrahydrofurfuryl alcohol. In the broad practice of the invention, the removal composition may comprise, consist of, or consist essentially of any of the foregoing embodiments.

The low-k dielectric materials removed using the removal compositions of the invention include CORAL™, BLACK DIAMOND™ (hereinafter BD), derivatives of CORAL, derivatives of BD, AURORA®, derivatives of AURORA®, etc. As used herein, "derivatives of CORAL" and "derivatives of BD" correspond to CORAL and BD materials, respectively, that were deposited using alternative, often proprietary, deposition processes. The utilization of a different processing technique will result in a CORAL and BD material that differs from CORAL™ and BLACK DIAMOND™, respectively. Another aspect of the invention relates to the removal compositions as used and further containing such low-k dielectric residue.

Further, the foregoing embodiments of the removal composition of the invention may further include low-k dielectric and metal stack material residue(s). Preferably, the low-k dielectric material comprises silicon-containing compounds that dissolve in the removal composition. In a particularly preferred embodiment, the removal composition includes at least one amine species, hydrofluoric acid, water, material residue, optionally at least one organic solvent, optionally at least one chelating agent, and optionally at least one additional acid species, wherein the material residue includes low-k dielectric material residue, metal stack material residue, and combinations thereof. In another particularly preferred embodiment, the removal composition includes at least one amine-hydrogen fluoride salt species, additional hydrofluoric acid, at least one organic solvent, at least one additional acid species, material residue and water, wherein the material residue includes low-k dielectric material residue, metal stack material residue, and combinations thereof.

The embodiments of this aspect of the invention may be formulated in the following Formulations A-BB, wherein all percentages are by weight, based on the total weight of the formulation:

Formulation A: Tetrafluoroboric acid 4.7 wt %; Triethanolamine:HF 11.7 wt %; HF 1.7 wt %; Ethylene glycol 39.6 wt %; Sulfolane 10.0 wt %; Butyl carbitol 15.0 wt %; Water 17.3 wt %

Formulation B: Tetrafluoroboric acid 4.7 wt %; Pyridine:HF 16.0 wt %; HF 1.7 wt %; Ethylene glycol 39.6 wt %; Sulfolane 10.0 wt %; Butyl carbitol 15.0 wt %; Water 13.0 wt %

Formulation C: Tetrafluoroboric acid 5.9 wt %; Pyridine:HF 8.0 wt %; HF 1.7 wt %; Ethylene glycol 39.6 wt %; Sulfolane 10.0 wt %; Butyl carbitol 19.0 wt %; Water 15.8 wt %

Formulation D: Acetic acid 17.0 wt %; Pyridine:HF 27.0 wt %; HF 1.2 wt %; Ethylene glycol 27.6 wt %; Sulfolane 10.0 wt %; DMSO 16.0 wt %; Water 1.2 wt %

Formulation E: Pyridine:HF 32.0 wt %; HF 1.3 wt %; Ethylene glycol 32.4 wt %; Sulfolane 13.0 wt %; DMSO 20.0 wt %; Water 1.3 wt %

Formulation F: Pyridine:HF 32.0 wt %; Propylene glycol 35.0 wt %; Sulfolane 13.0 wt %; DMSO 20.0 wt %

Formulation G: Pyridine:HF 31.1 wt %; HF 1.4 wt %; Propylene glycol 34.1 wt %; Sulfolane 12.6 wt %; DMSO 19.4 wt %; Water 1.4 wt %

Formulation H: Pyridine:HF 32.0 wt %; HF 1.7 wt %; Ethylene glycol 39.6 wt %; Sulfolane 10.0 wt %; DMSO 15.0 wt %; Water 1.7 wt %

Formulation I: Acetic acid 13.0 wt %; Isoxazole 7.0 wt %; HF 16.2 wt %; Ethylene glycol 22.1 wt %; Sulfolane 10.0 wt %; DMSO 15.0 wt %; Water 16.7 wt %

Formulation J: Acetic acid 13.0 wt %; 1,2,4-Triazole 7.0 wt %; HF 16.2 wt %; Ethylene glycol 22.1 wt %; Sulfolane 10.0 wt %; DMSO 15.0 wt %; Water 16.7 wt %

Formulation K: Acetic acid 13.0 wt %; Isoxazole 7.0 wt %; HF 16.3 wt %; Ethylene glycol 24.0 wt %; Sulfolane 15.0 wt %; Water 24.7 wt %

Formulation L: Acetic acid 13.0 wt %; Isoxazole 7.0 wt %; HF 16.3 wt %; Ethylene glycol 24.0 wt %; Sulfolane 10.0 wt %; NMP 13.0 wt %; Water 16.7 wt %

Formulation M: Acetic acid 13.0 wt %; Isoxazole 7.0 wt %; HF 16.3 wt %; Ethylene glycol 24.0 wt %; Sulfolane 10.0 wt %; Methyl carbitol 13.0 wt %; Water 16.7 wt %

Formulation N: Acetic acid 13.0 wt %; Isoxazole 7.0 wt %; HF 16.3 wt %; Ethylene glycol 24.0 wt %; Sulfolane 10.0 wt %; Dipropylene glycol methyl ether 13.0 wt %; Water 16.7 wt %

Formulation O: Acetic acid 15.0 wt %; Isoxazole 9.0 wt %; HF 17.2 wt %; Ethylene glycol 25.9 wt %; Sulfolane 15.0 wt %; Water 17.9 wt %

Formulation P: Isoxazole 10.3 wt %; HF 20.4 wt %; Ethylene glycol 30.7 wt %; Sulfolane 17.2 wt %; Water 21.4 wt %

Formulation Q: acetic acid 21.1 wt %; Isoxazole 12.0 wt %; HF 23.0 wt %; Sulfolane 20.0 wt %; Water 23.9 wt %

Formulation R: acetic acid 18.0 wt %; Isoxazole 10.2 wt %; HF 20.2 wt %; Sulfolane 30.4 wt %; Water 21.2 wt %

Formulation S: acetic acid 26.4 wt %; Isoxazole 15.0 wt %; HF 28.7 wt %; Water 29.9 wt %

Formulation T: Isoxazole 15.2 wt %; HF 29.1 wt %; Sulfolane 25.4 wt %; Water 30.3 wt %

Formulation U: Isoxazole 20.4 wt %; HF 39.0 wt %; Water 40.6 wt %

Formulation V: 2-ethylpyridine 20.4 wt %; HF 39.0 wt %; Water 40.6 wt %

Formulation W: 2-Methoxypyridine 20.4 wt %; HF 39.0 wt %; Water 40.6 wt %

Formulation X: Piperidine 20.4 wt %; HF 39.0 wt %; Water 40.6 wt %

Formulation Y: NMMO 8.0 wt %; HF 17.6 wt %; Sulfolane 15.0 wt %; Butyl carbitol 33.0 wt %; Water 26.4 wt %

Formulation Z: 2-Methoxypyridine 7.0 wt %; HF 15.7 wt %; Sulfolane 61.0 wt %; Water 16.3 wt %

Formulation AA: NMMO 7.0 wt %; HF 15.7 wt %; Water 77.3 wt %

Formulation BB: NMMO 7.0 wt %; HF 15.7 wt %; Sulfolane 10.0 wt %; Water 67.3 wt %

Preferably, the range of weight percent ratios of the components are: about 0.1:1 to about 10:1 etchant(s) relative to amine(s), preferably about 1:1 to about 5:1, and most preferably about 2:1 to about 3:1; and about 1:1 to about 30:1 water relative to amine(s), preferably about 5:1 to about 20:1, and most preferably about 10:1 to about 15:1.

In another aspect, the present invention relates to removal compositions useful in removing materials selected from the group consisting of low-k dielectric material, etch stop layers, metal stack materials, and combinations thereof from the surface of a rejected microelectronic device structure, wherein said removal compositions are substantially devoid of amine species. By reducing the amount of amine present, the overall cost of the removal composition decreases and many supply chain problems are minimized. In addition, amines are known to react exothermically with HF, which can potentially lead to manufacturing issues such as particle generation. As defined herein, "substantially devoid" corresponds to less than about 1 wt. %, more preferably less than 0.5 wt. %, and most preferably less than 0.1 wt. % of the composition, based on the total weight of said composition.

Accordingly, this aspect of the present invention may include hydrofluoric acid and at least one organic solvent. More specifically, the compositions of the invention may include hydrofluoric acid, at least one organic solvent, water, optionally at least one organic acid, and optionally at least one chelating agent, present in the following ranges, based on the total weight of the composition:

| component | % by weight |
| --- | --- |
| hydrofluoric acid | about 0.01% to about 50.0% |
| organic solvent(s) | about 20% to about 70.0% |
| optional organic acid(s) | 0 to about 80.0% |
| optional chelating agent(s) | 0 to about 10% |
| water | about 0.01% to 80% |

In the broad practice of this aspect of the invention, the removal composition may comprise, consist of, or consist essentially of hydrofluoric acid, at least one organic solvent, water, optionally at least one organic acid, and optionally at least one chelating agent. In general, the specific proportions and amounts of hydrofluoric acid source(s), organic solvent(s), water, optional organic acid(s), and optional chelating agent(s), in relation to each other, may be suitably varied to provide the desired removal action of the composition for the materials selected from the group consisting of low-k dielectric material, etch stop layers, metal stack materials, and combinations thereof, and/or processing equipment, as readily determinable within the skill of the art without undue effort.

Preferably, this aspect of the present invention includes at least 10 wt % HF, based on the total weight of the composition. When copper stack material is not to be removed, the removal composition of this aspect is devoid of oxidizer and/or carbonate-containing species. Further, the amount of water present in the removal composition of this aspect is preferably in a range from 10 wt % to 80 wt. %, more preferably 10 wt % to about 75 wt %, based on the total weight of the composition.

Compositions of this aspect have a pH value in a range from about 1 to about 7, more preferably about 2.5 to about 4.5, most preferably about 2.8 to about 3.5, when diluted 20:1 with deionized water.

The preferred organic solvent(s), chelating agent(s), and organic acid(s) species were previously introduced hereinabove. Preferably, the water is deionized.

Such compositions may optionally include additional components, including active as well as inactive ingredients, e.g., surfactants, stabilizers, passivators, chelating agents, dispersants, pH stabilizing agents, oxidants, etc. For example, about 0.01 wt. % to about 10 wt. % surfactant may be added to the removal composition of the invention. Surfactants contemplated include nonionic, anionic, cationic (based on quaternary ammonium cations) and/or zwitterionic surfactants. For example, suitable non-ionic surfactants may include fluoroalkyl surfactants, ethoxylated fluorosurfactants, polyethylene glycols, polypropylene glycols, polyethylene or polypropylene glycol ethers, carboxylic acid salts, dodecylbenzenesulfonic acid or salts thereof, polyacrylate polymers, dinonylphenyl polyoxyethylene, silicone or modified silicone polymers, acetylenic diols or modified acetylenic diols, alkylammonium or modified alkylammonium salts, and alkylphenol polyglycidol ether, as well as combinations comprising at least one of the foregoing. In a preferred embodiment, the nonionic surfactant may be an ethoxylated fluorosurfactant such as ZONYL® FSO-100 fluorosurfactant (DuPont Canada Inc., Mississauga, Ontario, Canada). Anionic surfactants contemplated in the compositions of the present invention include, but are not limited to, fluorosurfactants such as ZONYL® UR and ZONYL® FS-62 (DuPont Canada Inc., Mississauga, Ontario, Canada), sodium alkyl sulfates, ammonium alkyl sulfates, alkyl ($C_{10}$-$C_{18}$) carboxylic acid ammonium salts, sodium sulfosuccinates and esters thereof, e.g., dioctyl sodium sulfosuccinate, and alkyl ($C_{10}$-$C_{18}$) sulfonic acid sodium salts. Cationic surfactants contemplated include alkyltetramethylammonium salts such as cetyltrimethylammonium bromide (CTAB) and cetyltrimethylammonium hydrogen sulfate. Suitable zwitterionic surfactants include ammonium carboxylates, ammonium sulfates, amine oxides, N-dodecyl-N,N-dimethylbetaine, betaine, sulfobetaine, alkylammoniopropyl sulfate, and the like.

Preferably, an embodiment of this aspect of the invention may be present in concentrated form and includes the following components present in the following ranges, based on the total weight of the composition:

| component | % by weight |
|---|---|
| hydrofluoric acid | about 5% to about 40% |
| organic solvent(s) | about 10% to about 70% |
| water | about 5% to 80% | and the pH of a 20:1 dilution of the removal composition in deionized water is in a range from about 2.5 to about 4.5. Optionally, about 0.01 wt. % to about 10 wt. % surfactant may be added.

Further, the foregoing embodiment of the removal composition of the invention may further include materials selected from the group consisting of low-k dielectric material, etch stop layers, metal stack materials, and combinations thereof. Preferably, the materials dissolve in the removal composition.

This embodiment may be formulated in the following Formulations CC-HH, wherein all percentages are by weight, based on the total weight of the formulation:
Formulation CC: HF 20.1 wt %; Butyl carbitol 57.5 wt %; Sulfolane 1.5 wt %; Water 20.9 wt %
Formulation DD: HF 37.4 wt %; Butyl carbitol 21.7 wt %; Sulfolane 2.2 wt %; Water 38.7 wt %
Formulation EE: HF 20.1 wt %; Butyl carbitol 21.7 wt %; Sulfolane 2.2 wt %; Water 56.0 wt %
Formulation FF: 10.04% HF, 10.8% butyl carbitol, 2.2% sulfolane and 76.96% water
Formulation GG: HF 20.1 wt %; Butyl carbitol 10.8 wt %; Sulfolane 2.2 wt %; Water 66.9 wt %
Formulation HH: HF 20.1 wt %; Butanol 10.8 wt %; Sulfolane 2.2 wt %; Water 66.9 wt %

Most preferably, the removal compositions of the invention are formulated in the following embodiments, wherein all percentages are by weight, based on the total weight of the formulation:

| component of | % by weight | preferably (% by weight) | most preferably (% by weight) |
|---|---|---|---|
| HF | about 0.01% to about 50% | about 5% to about 40% | about 10% to about 40% |
| organic solvent(s) | about 10% to about 70% | about 10% to about 65% | about 12% to about 30% or about 50% to about 60% |
| water | about 0.01% to 80% | about 10% to 80% | about 20% to 80% |

Most preferably, this aspect of the invention relates to a removal composition including hydrogen fluoride, diethylene glycol butyl ether, sulfolane and water. The range of weight percent ratios of the components are: about 0.1:1 to about 10:1 solvent(s) relative to etchant(s), preferably about 0.5:1 to about 5:1, and most preferably about 1:1 to about 3:1; and about 0.1:1 to about 10:1 water relative to etchant(s), preferably about 0.5:1 to about 5:1, and most preferably about 1:1 to about 3:1. Further, the removal composition may further include materials selected from the group consisting of low-k dielectric material, etch stop layers, metal stack materials, and combinations thereof, wherein the material is dissolved in the removal composition and the removal composition remains viable for its intended use.

In a particularly preferred embodiment of this aspect of the invention, the removal composition includes water, sulfolane, diethylene glycol butyl ether, and hydrogen fluoride, wherein the amount of water is in a range from 10 wt. % to about 75 wt. %, based on the total weight of the composition, with the provision that the composition is substantially devoid of amine.

In still another aspect of the invention, the compositions of the invention include at hydrofluoric acid, at least one organic solvent, at least one oxidizing agent, and water, with the provision that the composition be substantially devoid of amine. This compositional embodiment is particularly useful for the removal of low-k dielectric material, etch stop layers and/or the metal film stacks without damaging the underlying device substrate and without the re-deposition or precipitation of copper on the surface of said substrate. Oxidizing agents contemplated herein include, but are not limited to, hydrogen peroxide ($H_2O_2$), oxone, oxone tetrabutylammonium salt, ferric nitrate ($Fe(NO_3)_3$), potassium iodate ($KIO_3$), potassium permanganate ($KMnO_4$), nitric acid ($HNO_3$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), sodium persulfate ($Na_2S_2O_8$), potassium persulfate ($K_2S_2O_8$), tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$), urea hydrogen peroxide (($CO(NH_2)_2)H_2O_2$), peracetic acid ($CH_3(CO)OOH$), and combinations thereof. The oxidizing agent may be introduced to the composition at the manufacturer, prior to introduction of the composition to the device wafer, or alternatively at the device wafer, i.e., in situ.

Preferably, an embodiment of this aspect of the invention may be present in concentrated form and includes the following components present in the following ranges, based on the total weight of the composition:

| component | % by weight | preferred/% by weight |
|---|---|---|
| hydrofluoric acid | about 10% to about 40% | about 15% to about 25% |
| organic solvent(s) | about 10% to about 80% | about 20% to about 55% |
| water | about 10% to about 80% | about 15% to about 55% |
| oxidizing agent | about 0.1% to about 15% | about 1% to about 10% | and the pH of a 20:1 dilution of the removal composition in deionized water is in a range from about 2.5 to about 4.5.

Further, the foregoing embodiment of the removal composition of the invention may further include materials selected from the group consisting of low-k dielectric material, etch stop layers, metal stack materials, and combinations thereof. Preferably, the materials dissolve in the removal composition.

This embodiment may be formulated in the following Formulations II-KK, wherein all percentages are by weight, based on the total weight of the formulation:

Formulation II: HF 18.3 wt %; Butyl carbitol 52.3 wt %; Sulfolane 1.3 wt %; Water 19 wt %; $H_2O_2$ 9.1 wt %

Formulation JJ: HF 20.1 wt %; Butyl carbitol 21.7 wt %; Sulfolane 2.2 wt %; $H_2O_2$ 1 wt %; Water 55.0 wt %

Formulation KK: HF 20.1 wt %; Butyl carbitol 21.7 wt %; Sulfolane 2.2 wt %; $HNO_3$ 0.97 wt %; Water 55.3 wt %

In still another aspect of the invention, the compositions of the invention include at hydrofluoric acid, at least one organic solvent, at least one oxidizing agent, water, and at least one copper chelating agent, with the provision that the composition be substantially devoid of amine. This compositional embodiment is particularly useful for the removal of low-k dielectric material, etch stop layers and/or the metal film stacks without damaging the underlying device substrate and without the re-deposition or precipitation of copper on the surface of said substrate.

Preferably, an embodiment of this aspect of the invention may be present in concentrated form and includes the following components present in the following ranges, based on the total weight of the composition:

| component | % by weight | preferred/% by weight |
| --- | --- | --- |
| hydrofluoric acid | about 5% to about 30% | about 10% to about 20% |
| organic solvent(s) | about 5% to about 40% | about 10% to about 25% |
| water | about 40% to about 90% | about 50% to 80% |
| oxidizing agent | about 0.1% to about 15% | about 1% to about 5% |
| chelating agent | about 0.01% to about 5% | about 0.1% to about 2% | and the pH of a 20:1 dilution of the removal composition in deionized water is in a range from about 2.5 to about 4.5.

Further, the foregoing embodiment of the removal composition of the invention may further include materials selected from the group consisting of low-k dielectric material, etch stop layers, metal stack materials, and combinations thereof. Preferably, the materials dissolve in the removal composition.

This embodiment may be formulated in the following Formulations LL-QQ, wherein all percentages are by weight, based on the total weight of the formulation:

Formulation LL: HF 20.1 wt %; Butyl carbitol 21.7 wt %; Sulfolane 2.2 wt %; $H_2O_2$ 1 wt %; CDTA 0.15 wt %; Water 54.85 wt %

Formulation MM: HF 20.1 wt %; Butyl carbitol 21.7 wt %; Sulfolane 2.2 wt %; $H_2O_2$ 1 wt %; EDTA 0.15 wt %; Water 54.85 wt %

Formulation NN: HF 20.1 wt %; Butyl carbitol 21.7 wt %; Sulfolane 2.2 wt % $H_2O_2$ 1 wt %; MEA 0.15 wt %; Water 54.85 wt %

Formulation OO: HF 10.04 wt %; Butyl carbitol 10.8 wt %; Sulfolane 2.2 wt %; $H_2O_2$ 1 wt %; CDTA 0.15 wt %; Water 75.81 wt %

Formulation PP: HF 10.04 wt %; Butyl carbitol 10.8 wt %; Sulfolane 2.2 wt %; $H_2O_2$ 1 wt %; acac 2 wt %; Water 73.96 wt %

Formulation QQ: HF 10.04 wt %; Butyl carbitol 10.8 wt %; Sulfolane 2.2 wt %; $H_2O_2$ 5 wt %; CDTA 0.15 wt %; Water 71.81 wt %

Preferably, the range of weight percent ratios of the components are: about 0.1:1 to about 10:1 etchant(s) relative to oxidant(s), preferably about 0.5:1 to about 5:1, and most preferably about 1:1 to about 3:1; about 0.1:1 to about 10:1 solvent(s) relative to oxidant(s), preferably about 1:1 to about 5:1, and most preferably about 2:1 to about 3.5:1; about 0.001:1 to about 0.1 chelating agent(s) relative to oxidant(s), preferably about 0.01:1 to about 0.05:1; and about 1:1 to about 30:1 water relative to oxidant(s), preferably about 5:1 to about 25:1, and most preferably about 10:1 to about 20:1.

Importantly, the chelating agent may be introduced to the composition of this aspect at the manufacturer, prior to introduction of the composition to the device wafer, or alternatively at the device wafer, i.e., in situ. It is further contemplated that in addition to chelating agent(s), other components may be added to the composition to dilute, maintain and/or increase the concentration of other components in the composition.

The low-k dielectric materials removed using the removal compositions of the invention include CORAL™, BLACK DIAMOND™ (hereinafter BD), derivatives of CORAL, derivatives of BD, AURORA®, derivatives of AURORA®, etc. As used herein, "derivatives of CORAL" and "derivatives of BD" correspond to CORAL and BD materials, respectively, that were deposited using alternative, often proprietary, deposition processes. The utilization of a different processing technique will result in a CORAL and BD material that differs from CORAL™ and BLACK DIAMOND™, respectively. Another aspect of the invention relates to the removal compositions as used and further containing such low-k dielectric residue.

Importantly, the removal compositions of this aspect are also effective at concurrently removing polymers, metal stack materials, etch stop layers, and/or other residue from a surface of the microelectronic device. For example, the removal compositions may effectively remove low-k dielectric material from one side of the microelectronic device while concurrently removing polymer and other residue from the other side of the microelectronic device. As such, as applied to microelectronic device manufacturing operations, the removal compositions of the present aspect of the invention are usefully employed to remove material selected from the group consisting of low-k dielectric material, etch stop layers, metal stack materials, and combinations thereof from rejected microelectronic device structures, including wafers comprising silicon, for recycling and/or reuse of said structures. Importantly, the removal compositions of the invention satisfy the wafer reclamation requirements, including less than 50 particles at 0.12 μm, a total thickness variation less than the industry standard of 5 μm, and/or a metal surface contamination of less than $1 \times 10^{10}$ atoms $cm^{-2}$. Furthermore, because of the low TTV, an additional chemical mechanical polishing (CMP) step, i.e., to planarize the substrate subsequent to the wet removal of the materials, may not be needed to planarize the front-side and backside of the wafer before reuse. Alternatively, the parameters of the CMP step may be altered such that the energy requirements are substantially reduced, e.g., the length of time of the polish is shortened, etc. Most preferably, the TTV is less than 3%, more preferably less than 1% and most preferably less than 0.5%, subsequent to the removal of the materials from the microelectronic device substrate.

In addition, it should be appreciated that any of the removal compositions disclosed herein may be used during (CMP) processes, i.e., to planarize copper and remove barrier layer materials, to accelerate the removal of CDO and other low-k dielectric materials, as readily determinable by one skilled in the art. Importantly, when the application requires stopping on a copper layer, for example during CMP processing, and the removal composition includes at least one chelating agent, the removal composition preferably further includes at least one copper passivator species. Contemplated copper passivator species include, but are not limited to, 1,2,4-triazole, benzotriazole (BTA), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzoimidizole (MBI), 2-mercaptobenzothiazole, 4-methyl-2-phenylimidazole, 2-mercaptothiazoline, 5-aminotetrazole (ATA), 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, mercaptobenzothiazole, imidazoline thione, mercaptobenzimidazole, 4-methyl-4H-1,2,4-triazole-3-thiol, 5-amino-1,3,4-thiadiazole-2-thiol, benzothiazole, tritolyl phosphate, indiazole, and combinations thereof. Dicarboxylic acids such as oxalic acid, malonic acid, succinic acid, nitrilotriacetic acid, iminodiacetic acid, and combinations thereof are also useful copper passivator species. It is also contemplated herein that the removal compositions of the invention may be diluted with a solvent such as water and used as a post-chemical mechanical polishing (CMP) composition to remove post-CMP residue including, but not limited to, particles from the polishing slurry, carbon-rich particles, polishing pad particles, brush deloading particles, equipment materials of construction particles, copper, copper oxides, and any other materials that are the by-products of the CMP process. When used in post-CMP applications, the concentrated removal compositions may be diluted in a range from about 1:1 to about 1000:1 solvent to concentrate, wherein the solvent can be water and/or organic solvent.

In yet another aspect, any of the removal compositions disclosed herein may be buffered to a pH in a range from about 5 to about 8, preferably about 5.5 to about 7, to minimize corrosion of the materials of construction in the fab, e.g., steel drainage systems and other tools, as readily determinable by one skilled in the art. Contemplated buffering species include, but are not limited to organic quaternary bases, alkali bases, alkaline earth metal bases, organic amines, alkoxides, amides, and combinations thereof. More specifically, the buffering species may include benzyltrimethylammonium hydroxide, benzyltriethylammonium hydroxide, benzyltributylammonium hydroxide, dimethyldiethylammonium hydroxide, tetramethyl ammonium hydroxide, tetraethyl ammonium hydroxide, tetrapropyl ammonium hydroxide, tetrabutyl ammonium hydroxide, ammonium hydroxide, potassium hydroxide, cesium hydroxide, rubidium hydroxide, alkyl phosphonium hydroxides, and derivatives thereof, Aniline, Benzimidazole, Benzylamine, 1-Butanamine, n-Butylamine, Cyclohexanamine, Diisobutylamine, Diisopropylamine, Dimethylamine, Ethanamide, Ethanamine, Ethylamine, Ethylenediamine, 1-Hexanamine, 1,6-Hexanediamine, Pyrazine, Pyridazine, Urea, N-methylpyrrolidone, diglycolamine, pyridine, triethylamine, monoethanolamine, triethanolamine, aminoethylethanolamine, N-methylaminoethanol, aminoethoxyethanol, dimethylaminoethoxyethanol, diethanolamine, N-methyldiethanolamine, 2 methoxy pyridine, isoxazole, 1,2,4 triazole and derivatives thereof.

Most preferably, the removal compositions of the invention are formulated in the following embodiments, wherein all percentages are by weight, based on the total weight of the formulation:

| component of | % by weight | preferably (% by weight) | most preferably (% by weight) |
|---|---|---|---|
| HF | about 0.01% to about 50% | about 5% to about 35% | about 10% to about 25% |
| organic solvent(s) | about 20% to about 70% | about 10% to about 65% | about 15% to about 30% or about 50% to about 60% |
| water | about 0.01% to about 80% | about 10% to about 80% | about 20% to about 80% |
| oxidizing agent(s) | 0 to about 10% | about 0.01 to about 7% | about 0.1 to about 5% |
| chelating agent(s) | 0 to about 5% | about 0.01% to about 1% | about 0.01% to about 0.5% |

The removal compositions of the invention are easily formulated by simple addition of the respective ingredients and mixing to homogeneous condition. Furthermore, the removal compositions may be readily formulated as single-package formulations or multi-part formulations that are mixed at the point of use. The individual parts of the multi-part formulation may be mixed at the tool or in a storage tank upstream of the tool. The concentrations of the respective ingredients may be widely varied in specific multiples of the removal composition, i.e., more dilute or more concentrated, in the broad practice of the invention, and it will be appreciated that the removal compositions of the invention can variously and alternatively comprise, consist or consist essentially of any combination of ingredients consistent with the disclosure herein.

Accordingly, one aspect of the invention relates to concentrated formulations of the compositions described herein with low amounts of water and/or solvent, or alternatively without water and/or solvent, wherein water and/or solvent may be added prior to use to form the removal compositions of the invention. The concentrated formulations may be diluted in a range from about 1:10 to 10:1 solvent to concentrate, wherein the solvent can be water and/or organic solvent.

Accordingly, another aspect of the invention relates to a kit including, in one or more containers, one or more components adapted to form the removal compositions of the invention. The kit may include, in one or more containers, at least one amine, hydrofluoric acid, optionally at least one organic solvent, optionally at least one chelating agent, optionally at least one additional acid, and optionally water for combining at the fab. Alternatively, the kit may include at least one amine, hydrofluoric acid, at least one organic solvent, and at least one additional acid, for combining with the water and/or organic solvent at the fab. In still another embodiment, the kit may include at least one amine, hydrofluoric acid, water, and at least one additional acid, for combining with the water and/or organic solvent at the fab. In yet another alternative, the kit may include, in one or more containers, at least one amine-hydrogen fluoride salt, additional hydrofluoric acid, at least one organic solvent, and optionally at least one additional acid, for combining with water and/or organic solvent at the fab.

Alternatively, the kit may include, in one or more containers, hydrofluoric acid, at least one organic solvent, optionally at least one chelating agent, and optionally at least one organic acid, for combining with the water and/or organic solvent at the fab. It should be appreciated that the kit may include any of the components of the foregoing embodiments, in any combination, as readily determined by one skilled in the art. The containers of the kit should be chemically rated to store and dispense the component(s) contained therein. For example, the containers of the kit may be NOW-Pak® containers (Advanced Technology Materials, Inc., Danbury, Conn., USA).

In addition to a liquid solution, it is also contemplated herein that the removal compositions may be formulated as foams, fogs, subcritical or supercritical fluids (i.e., wherein the solvent is $CO_2$, etc., instead of water and/or organic solvent(s)).

Importantly and advantageously, the removal compositions dissolve materials selected from the group consisting of low-k dielectric material, etch stop layers, metal stack materials, and combinations thereof from the microelectronic device substrate (i.e., bare silicon, polysilicon) rather than delaminate said material therefrom. Dissolution has the advantage of minimizing the generation of particulate matter that may subsequently settle on said substrate as well as substantially eliminating clogging of the removal equipment. In addition, the underlying wafer device remaining following the removal process using the compositions of the invention is substantially smooth and undamaged.

In yet another aspect, the invention relates to methods of removal of materials selected from the group consisting of low-k dielectric layers, etch stop layers, metal stack materials, and combinations thereof from a microelectronic device having said layers thereon using the removal compositions described herein. For example, low-k dielectric materials may be removed while maintaining the integrity of the underlying polysilicon, bare Si, etch stop layers (e.g., SiCN, SiCO, SiC, SiON, SiGe, SiGeB, SiGeC, AlAs, InGaP, InP, InGaAs), and metal stack materials. Alternatively, low-k dielectric layers and metal stack materials may be removed while maintaining the integrity of the underlying polysilicon, bare Si layers, and/or etch stop layers (e.g., SiCN, SiCO, SiC, SiON, SiGe, SiGeB, SiGeC, AlAs, InGaP, InP, InGaAs). In another alternative, low-k dielectric layers, etch stop layers and metal stack materials may be removed while maintaining the integrity of the underlying polysilicon and bare Si layers.

In a further aspect, the invention relates to methods of removal of low-k dielectric layers from one side of the microelectronic device and polymer or other residues from the other side of the microelectronic device.

In removal application, the removal composition is applied in any suitable manner to the rejected microelectronic device having material to be removed thereon, e.g., by spraying the removal composition on the surface of the device, by dipping (in a volume of the removal composition) of the device including the low-k dielectric material, by contacting the device with another material, e.g., a pad, or fibrous sorbent applicator element, that has said removal composition absorbed thereon, by contacting the device including the material to be removed with a circulating removal composition, or by any other suitable means, manner or technique, by which the removal composition is brought into removal contact with the material to be removed. Further, batch or single wafer processing is contemplated herein. The removal process using the removal compositions may include a static clean, a dynamic clean, or sequential processing steps including dynamic cleaning, followed by static cleaning of the device in the removal composition, with the respective dynamic and static steps being carried out alternatingly and repetitively, in a cycle of such alternating steps.

The removal compositions may be used with a large variety of conventional cleaning tools, including Verteq single wafer megasonic Goldfinger, OnTrak systems DDS (double-sided scrubbers), Laurell spin-spray tools, SEZ single wafer spray rinse, Applied Materials Mirra-Mesa™/Reflexion™/Reflexion LK™, and Megasonic batch wet bench systems.

As applied to microelectronic device manufacturing operations, the removal compositions of the present invention are usefully employed to remove material selected from the group consisting of low-k dielectric material, etch stop layers, metal stack materials, and combinations thereof from rejected microelectronic device structures for recycling and/or reuse of said structures. In addition, it should be appreciated that the removal compositions may be used during chemical mechanical polishing processes to accelerate the removal of CDO and other low-k dielectric materials or post-CMP processes to remove post-CMP residue material.

The compositions of the present invention, by virtue of their selectivity for such material(s), relative to other materials that may be present on the microelectronic device structure and exposed to the removal composition, such as polysilicon, bare Si, etc., to achieve at least partial removal of the material(s) in a highly efficient manner.

In use of the compositions of the invention for removing material selected from the group consisting of low-k dielectric material, etch stop layers, metal stack materials, and combinations thereof from microelectronic device structures having same thereon, the removal composition typically is contacted with the device structure for a time of from about 30 seconds to about 60 minutes, more preferably about 75 sec to about 5 min, the preferred time being dependent on the thickness of the layer(s) to be removed, at temperature in a range of from about 20° C. to about 90° C., preferably about 25° C. to about 60° C., most preferably about 25° C. to about 50° C. When etch stop layers are to be removed, the contacting time may be in a range of from about 5 minutes to about 3 hours at temperature in a range of from about 25° C. to about 80°, depending on the thickness of the etch stop layer. Such contacting times and temperatures are illustrative, and any other suitable time and temperature conditions may be employed that are efficacious to at least partially remove the material(s) from the device structure, within the broad practice of the invention. As defined herein, "at least partial dissolution" corresponds to at least 90% dissolution removal of material, preferably at least 95% dissolution removal of material. Most preferably, at least 99% of the material is dissolvably removed using the compositions of the present invention.

Following the achievement of the desired removal action, the removal composition is readily removed from the microelectronic device to which it has previously been applied, e.g., by rinse, wash, or other removal step(s), as may be desired and efficacious in a given end use application of the compositions of the present invention. For example, the microelectronic device may be rinsed with deionized water. In addition, the microelectronic device may be dried with nitrogen gas or SEZ (spin process technology).

In a further aspect, the present invention relates to methods of manufacturing an article comprising a microelectronic device, said method comprising contacting a rejected microelectronic device structure with the removal compositions of the present invention for sufficient time to at least partially remove material selected from the group consisting of low-k dielectric material, etch stop layers, metal stack materials, and combinations thereof from the microelectronic device structure to yield a reusable microelectronic device structure, and optionally further comprising applying one or more layers to the reusable microelectronic device structure, including at least one low-k dielectric material layer, in a subsequent multi-layer microelectronic device manufacturing process and incorporating said microelectronic device into said article.

Typically, the wet bench tools in the art consist of two baths—one for the removal composition and one for rinsing the device wafer subsequent to immersion in the removal composition. Disadvantageously, the pH of the rinse bath can become very acidic following immersion of the device wafers having fluoride-containing removal compositions. As previously discussed, a solution having high fluoride concentrations (and high organic solvent concentrations) may cause significant disposal problems. Accordingly, a process is needed to ensure that the rinse water does not become too acidic. Towards that end, the present invention further relates to the incorporation of a third bath in the wet bench tool, specifically a neutralizing bath for use subsequent to the removal composition bath but prior to the rinse bath, said bath being useful for neutralizing the high fluoride content of the removal composition that remains on the device wafer following immersion therein. As such, in yet another aspect, the present invention broadly relates to a method of at least partially removing low-k dielectric material from the microelectronic device structure using the removal compositions of the invention, neutralizing the wafer surface using a buffer rinse step and rinsing the neutralized wafer with water.

In a preferred embodiment, the present aspect of the invention relates to a method of removing low-k dielectric material from a microelectronic device having said low-k dielectric material thereon, said method comprising:

contacting the microelectronic device with a removal composition for sufficient time to at least partially remove said low-k dielectric material from the microelectronic device, wherein the removal composition includes hydrofluoric acid, and at least one amine species, and wherein the pH of a 20:1 dilution of the removal composition in water is in a range from about 2.5 to about 4.5;

contacting the microelectronic device having removal composition thereon with a neutralizing composition to neutralize the removal composition on the microelectronic device; and rinsing the microelectronic device having neutralized removal composition thereon with water to remove the neutralized removal composition therefrom.

Preferably, the neutralizing compositions include at least one buffering species wherein the pH of the neutralized removal composition is in a range from about 5 to about 9, more preferably in a range from about 6 to about 8, and most preferably about 7. Buffering species contemplated herein include, but are not limited to, commercial color-coded buffer solutions or customized solutions including bases such as hydroxides, carbonates, phosphates, diphosphates, etc., and base/salt mixtures.

The features and advantages of the invention are more fully shown by the illustrative examples discussed below.

EXAMPLE 1

The pH of Formulation A diluted 20:1 with DI water was determined to be 3.2.

Bare Si substrates having blanketed BD materials thereon were statically soaked in concentrated Formulation A for 2 min to 5 min at 40° C. to 60° C. as indicated in Table 1. The BD material layers were characterized by the method of depositing the BLACK DIAMOND™ material as well as the thickness of the BD layers. The first bare Si substrate had a blanketed BLACK DIAMOND™ layer deposited using the proprietary BLACK DIAMOND™ process and had a thickness of approximately 6,500 Å (hereinafter BDTM). The second bare Si substrate had a blanketed BD derivative material deposited using a proprietary deposition process and had a thickness of approximately 13,000 Å (hereinafter BDD1). The third bare Si substrate had a blanketed BD derivative material deposited using another proprietary deposition process and had a thickness of approximately 12,000 Å (hereinafter BDD2).

The results of the static soak are summarized in Table 1 hereinbelow, whereby a "yes" denotes that the specific BD material was substantially dissolved in the composition at the specified temperature at the specified time.

TABLE 1

Results of static soak of BD materials in diluted Formulation A.

| | 40° C. | | | 50° C. | | | 60° C. | | |
|---|---|---|---|---|---|---|---|---|---|
| time | BDTM | BDD1 | BDD2 | BDTM | BDD1 | BDD2 | BDTM | BDD1 | BDD2 |
| 2 min | no | no | no | yes | no | yes | yes | yes | yes |
| 3 min | yes | no | yes | yes | yes | yes | yes | yes | yes |
| 4 min | yes | yes | yes | yes | yes | yes | yes | yes | yes |
| 5 min | yes | yes | yes | yes | yes | yes | yes | yes | yes |

It can be seen that the dissolution of the BD materials from the surface of the substrate was dependent on the time of soaking, the temperature as well as the thickness of the BD material.

EXAMPLE 2

Blanketed polysilicon was statically soaked in Formulation A for 30 minutes at various temperatures and the etch rate of the polysilicon determined. The results are summarized in Table 2 hereinbelow.

TABLE 2

Results of static soak of polysilicon in Formulation A.

| temperature/° C. | PolySi etch rate/Å min$^{-1}$ |
|---|---|
| 40 | 1.1 |
| 50 | 1.4 |
| 60 | 1.7 |

It can be seen that the etch rate of polysilicon in Formulation A was negligible in the temperature range studied herein at extreme soaking conditions, e.g., a soak for 30 minutes. This suggests that Formulation A will not damage the underlying polysilicon material.

EXAMPLE 3

Samples of bare silicon, BDTM, BDD1, and BDD2 were statically soaked in Formulation A for 200 minutes at 60° C. to mimic extreme soaking conditions. Following immersion for the specified time, the samples were removed from the static soak bath, rinsed, dried and the Atomic Force Microscopic (AFM) surface roughness determined. The results are reported in Table 3 hereinbelow.

TABLE 3

Results of static soak of bare Si and BD materials in Formulation A.

| | | Formulation A | | |
|---|---|---|---|---|
| | control bare Si (nm) | bare Si (nm) | BDTM (nm) | BDD1 (nm) | BDD2 (nm) |
| 1 m scan | 0.174 | 0.402 | 0.336 | 0.405 | 0.380 |
| 5 m scan | 0.145 | 0.688 | 0.296 | 0.571 | 0.503 |

It can be seen that the bare Si substrate was not significantly damaged during the extreme soak of the respective substrates in Formulation A. For example, the largest numerical change from 0.145 nm to 0.688 nm equates to negligible damage to the surface of the bare Si surface. These results suggest that Formulation A will not damage the underlying bare Si substrate either.

EXAMPLE 4

The bath life of Formulation A at 60° C. in an open and closed environment was evaluated, and the mass of Formulation A was determined in 24 hr intervals over the course of four days. At t=0, 24, 48, 72 and 96 hr, a bare Si substrate having BDTM thereon was immersed in the formulation for 10 minutes and the effectiveness of the formulation for removing the BDTM from said substrate visually evaluated. The results are summarized in Table 4 hereinbelow.

TABLE 4

Results of bath life testing of Formulation A.

| | open bottle | | closed bottle | |
|---|---|---|---|---|
| time | weight loss/g | BDTM clean? | weight loss/g | BDTM clean? |
| 0 hr | — | yes | — | yes |
| 24 hr | 52.50 | yes | 0.38 | yes |
| 48 hr | 11.69 | yes | 0.09 | yes |
| 72 hr | 4.58 | yes | 0.06 | yes |
| 96 hr | 14.33 | yes | 0.01 | yes |

The results suggest that Formulation A has a useful bath-life, regardless of whether the formulation became more concentrated over the course of four days (i.e., the open bottle wherein water evaporated over time). In addition, the formulation remained viable over the length of the experiment and continued to remove the BDTM from the bare Si substrate even after four days. Importantly, no solids were detected in the bottles after 96 hr at 60° C. or when the bottles were cooled to room temperature.

EXAMPLE 5

The pH of Formulation B diluted 20:1 with DI water was determined to be 3.3.

Bare Si substrates having blanketed BD materials thereon (as described hereinabove in Example 1) were statically soaked in concentrated Formulation B for 1 min to 2 min at 30° C. to 50° C. as indicated in Table 5. The results of the static soak are summarized in Table 5 hereinbelow, whereby a "yes" denotes that the specific BD material was substantially dissolved in the composition at the specified temperature during the soak for the specified time.

TABLE 5

Results of static soak of BD materials in diluted Formulation B.

| | 30° C. | | | 40° C. | | | 50° C. | | |
|---|---|---|---|---|---|---|---|---|---|
| time | BDTM | BDD1 | BDD2 | BDTM | BDD1 | BDD2 | BDTM | BDD1 | BDD2 |
| 1 min | yes | no | yes | yes | yes | yes | yes | yes | yes |
| 2 min | yes | yes | yes | yes | yes | yes | yes | yes | yes |

It can be seen that the dissolution of the BD materials from the surface of the substrate was dependent on the time of soaking, the temperature as well as the thickness of the BD material. In addition, the extent of dissolution was dependent on the formulation tested. For example, Formulation A at 40° C. and 2 minutes of soaking failed to completely dissolve BDTM however, Formulation B under the same conditions did substantially dissolve the BDTM from the bare Si substrate.

EXAMPLE 6

Blanketed polysilicon was statically soaked in Formulation B for 30 minutes at various temperatures and the etch rate of the polysilicon determined. The results are summarized in Table 6 hereinbelow.

TABLE 6

Results of static soak of polysilicon in Formulation B.

| temperature/° C. | PolySi etch rate/Å min$^{-1}$ |
|---|---|
| 30 | 0.7 |
| 40 | 0.9 |
| 50 | 1.3 |
| 60 | 1.8 |

It can be seen that the etch rate of polysilicon in Formulation B was negligible in the temperature range studied herein at extreme soaking conditions, e.g., a soak for 30 minutes. This suggests that Formulation B will not damage the underlying polysilicon material. In addition, because polysilicon should etch more rapidly that bare Si, it can be assumed that Formulation B will not damage bare Si either.

EXAMPLE 7

Samples of bare silicon, BDTM, BDD1, and BDD2 were statically soaked in Formulation B for 200 minutes at 60° C. to mimic extreme soaking conditions. Following immersion for the specified time, the samples were removed from the static soak bath, rinsed, dried and the Atomic Force Microscopic (AFM) surface roughness determined. The results are reported in Table 7 hereinbelow.

TABLE 7

Results of static soak of bare Si and BD materials in Formulation B.

| | | Formulation B | | |
|---|---|---|---|---|
| | control bare Si (nm) | bare Si (nm) | BDTM (nm) | BDD1 (nm) | BDD2 (nm) |
| 5 m scan | 0.145 | 0.360 | 0.232 | 0.280 | 0.432 |

It can be seen that the bare Si substrate was not significantly damaged during the extreme soak of the respective substrates in Formulation B. For example, the largest numerical change from 0.145 nm to 0.432 nm equates to negligible damage to the surface of the bare Si surface.

EXAMPLE 8

The bath life of Formulation B at 50° C. in an open and closed environment was evaluated, and the mass of Formulation B was determined in 24 hr intervals over the course of four days. At t=0, 24, 48, 72 and 96 hr, a bare Si substrate having BDTM thereon was immersed in the formulation for 5 minutes and the effectiveness of the formulation for removing the BDTM from said substrate visually evaluated. The results are summarized in Table 8 hereinbelow.

TABLE 8

Results of bath life testing of Formulation B.

| | open bottle | | closed bottle | |
|---|---|---|---|---|
| time | weight loss/g | BDTM clean? | weight loss/g | BDTM clean? |
| 0 hr | — | yes | — | yes |
| 24 hr | 28.93 | yes | 0.05 | yes |
| 48 hr | 20.93 | yes | 0.21 | yes |
| 72 hr | 13.47 | yes | 0.16 | yes |
| 96 hr | 6.25 | yes | 0.17 | yes |

The results suggest that Formulation B has a useful bath-life, regardless of whether the formulation became more concentrated over the course of four days (i.e., the open bottle wherein water evaporated over time). In addition, the formulation remained viable over the length of the experiment and continued to remove the BDTM from the bare Si substrate even after four days. Importantly, no solids were detected in the bottles after 96 hr at 60° C. or when the bottles were cooled to room temperature.

EXAMPLE 9

The pH of Formulation C diluted 20:1 with DI water was determined to be 3.1.

Bare Si substrates having blanketed BD materials thereon (as described hereinabove in Example 1) were statically soaked in concentrated Formulation C for 1 min to 2 min at 30° C. to 50° C. as indicated in Table 9. The results of the static soak are summarized in Table 9 hereinbelow, whereby a "yes" denotes that the specific BD material was substantially dissolved in the composition at the specified temperature during the soak for the specified time.

TABLE 9

Results of static soak of BD materials in diluted Formulation C.

| | 30° C. | | | 40° C. | | | 50° C. | | |
|---|---|---|---|---|---|---|---|---|---|
| time | BDTM | BDD1 | BDD2 | BDTM | BDD1 | BDD2 | BDTM | BDD1 | BDD2 |
| 1 min | yes | no | yes | yes | no | yes | yes | no | yes |
| 2 min | yes | yes | yes | yes | yes | yes | yes | yes | yes |

It can be seen that the dissolution of the BD materials from the surface of the substrate was dependent on the time of soaking, and the thickness of the BD material. In addition, the dissolution was dependent on the formulation tested. For example, Formulation A at 40° C. and 2 minutes of soaking failed to completely dissolve BDTM, however, Formulation C under the same conditions did substantially dissolve the BDTM from the bare Si substrate.

EXAMPLE 10

Blanketed polysilicon was statically soaked in Formulation C for 30 minutes at various temperatures and the etch rate of the polysilicon determined. The results are summarized in Table 10 hereinbelow.

TABLE 10

Results of static soak of polysilicon in Formulation C.

| temperature/° C. | PolySi etch rate/Å min$^{-1}$ |
|---|---|
| 30 | 0.5 |
| 40 | 0.7 |
| 50 | 0.9 |
| 60 | 1.2 |

It can be seen that the etch rate of polysilicon in Formulation C was negligible in the temperature range studied herein at extreme soaking conditions, e.g., a soak for 30 minutes. This suggests that Formulation C will not damage the underlying polysilicon material. In addition, because polysilicon should etch more rapidly that bare Si, it can be assumed that Formulation C will not damage bare Si either.

EXAMPLE 11

Bare Si substrates having a blanketed CORAL™ layer having a thickness of approximately 22,000±1,000 Å thereon were statically soaked in Formulations D-H for 3 min to 5 min at temperatures ranging from 60° C. to 70° C. Following immersion for the specified time, the substrate was rinsed with DI water, dried, and the amount of CORAL™ removed and the etch rate determined using a Nanospec. The results are summarized in Table 11 hereinbelow.

TABLE 11

Results of static soak of CORAL ™ in Formulations D-H.

| | | 60° C. | | 70° C. | |
|---|---|---|---|---|---|
| Formulation | time | total loss/Å | etch rate/ Å min$^{-1}$ | total loss/Å | etch rate/ Å min$^{-1}$ |
| D | 3 min | 6,956 | 2,319 | 14,727 | 4,909 |
|   | 5 min | 11,901 | 2,380 | 22,211 (cleared) | >4,442 |
| E | 3 min | 7,427 | 2,476 | 12,025 | 4,008 |
|   | 5 min | 14,099 | 2,820 | 21,886 (cleared) | >4,377 |
| F | 3 min | 5,349 | 1,783 | — | — |
|   | 5 min | 7,422 | 1,484 | — | — |
| G | 3 min | 5,612 | 1,871 | 8,739 | 2,913 |
|   | 5 min | 8,522 | 1,704 | 15,673 | 3,135 |
| H | 3 min | 7,336 | 2,445 | — | — |
|   | 5 min | 13,051 | 2,610 | — | — |

It can be concluded herein that Formulations D through H provide moderately good CORAL etch rates.

EXAMPLE 12

Bare Si substrates having a blanketed CORAL™ layer having a thickness of approximately 22,000±1,000 Å thereon were statically soaked in Formulations I-O for 3 min and/or 5 min at temperatures ranging from 30° C. to 60° C. Following immersion for the specified time, the substrate was rinsed with DI water, dried, and the amount of CORAL™ removed and the etch rate determined using a Nanospec. The results are summarized in Table 12 hereinbelow.

TABLE 12

Results of static soak of CORAL ™ in Formulations I-O.

| | | 30° C. | | 40° C. | | 50° C. | | 60° C. | |
|---|---|---|---|---|---|---|---|---|---|
| Form. | time | total loss/Å | etch rate/ Å min$^{-1}$ | total loss/Å | etch rate/ Å min$^{-1}$ | total loss/Å | etch rate/ Å min$^{-1}$ | total loss/Å | etch rate/ Å min$^{-1}$ |
| I | 3 min | 5,764 | 1,921 | 16,302 | 5,434 | 21,995 (cleared) | >7,332 | 22,895 (cleared) | >7,298 |
|   | 5 min | 15,263 | 3,053 | 21,762 (cleared) | >4,352 | 22,123 (cleared) | >4,425 | 22,110 (cleared) | >4,422 |
| J | 3 min | 2,424 | 808 | 7,479 | 2,492 | 10,565 | 3,521 | 13,463 | 4,488 |
|   | 5 min | 10,146 | 2,029 | 14,869 | 2,974 | 19,742 | 3,948 | 22,283 (cleared) | >4,457 |
| K | 3 min | 10,818 | 3,606 | 21,881 | 7,294 | 21,655 (cleared) | >7,218 | 22,476 (cleared) | >7,492 |
| L | 3 min | 11,603 | 3,868 | 22,420 (cleared) | >7,473 | 22,270 (cleared) | >7,423 | 22,278 (cleared) | >7,426 |
| M | 3 min | 6,981 | 2,327 | 18,537 | 6,179 | 21,826 (cleared) | >7,275 | 22,170 (cleared) | >7,390 |
| N | 3 min | 9,545 | 3,182 | 18,907 | 6,302 | 22,260 (cleared) | >7,420 | 22,484 (cleared) | >7,495 |
| O | 3 min | 13,554 | 4,518 | 21,933 | 7,310 | 22,066 (cleared) | 7,355 | 22,479 (cleared) | >7,492 |

It can be seen that the use of isoxazole and TAZ in place of pyridine (i.e., formulations D-H) increases CORAL etch rates relative to those without isoxazole and TAZ, and that regardless of the organic solvent added, the etch rates are approximately the same.

EXAMPLE 13

Blanketed polysilicon was statically soaked in Formulations I-O for 30 minutes at various temperatures and the etch rate of the polysilicon determined. The results are summarized in Table 13 hereinbelow.

TABLE 13

Results of static soak of polysilicon in Formulations I-O.

| Formulation | PolySi etch rate at 30° C./ Å min$^{-1}$ | PolySi etch rate at 40° C./ Å min$^{-1}$ | PolySi etch rate at 50° C./ Å min$^{-1}$ | PolySi etch rate at 60° C./ Å min$^{-1}$ |
|---|---|---|---|---|
| I | 0.3 | 0.5 | 0.6 | 0.9 |
| J | 0.9 | 1.7 | 2.8 | 3.9 |
| K | — | 0.3 | — | — |
| L | — | 0.9 | — | — |
| M | — | 0.4 | — | — |
| N | — | 0.4 | — | — |
| O | — | 0.3 | — | — |

It can be seen that the etch rate of polysilicon in Formulations I-O was negligible in the temperature range studied herein at extreme soaking conditions, e.g., a soak for 30 minutes. This suggests that Formulations I-O will not damage the underlying polysilicon material. In addition, because polysilicon should etch more rapidly that bare Si, it can be assumed that Formulations I-O will not damage bare Si either.

EXAMPLE 14

Bare Si substrates having a blanketed CORAL™ layer having a thickness of approximately 22,000±1,000 Å thereon were statically soaked in Formulations P-R for 3 min at temperatures ranging from 30° C. to 50° C. Following immersion for the specified time, the substrate was rinsed with DI water, dried, and the amount of CORAL™ removed and the etch rate determined using a Nanospec. The results are summarized in Table 14 hereinbelow.

TABLE 14

Results of static soak of CORAL ™ in Formulations P-R.

| Formulation | time | 30° C. total loss/Å | 30° C. etch rate/ Å min$^{-1}$ | 50° C. total loss/Å | 50° C. etch rate/ Å min$^{-1}$ |
|---|---|---|---|---|---|
| P | 3 min | 16,098 | 5,366 | 21,907 (cleared) | >7,302 |
| Q | 3 min | 21,648 | 7,216 | 22,127 (cleared) | >7,376 |
| R | 3 min | 19,546 | 6,515 | 22,056 (cleared) | >7,352 |

It can be concluded herein that Formulations P-R provide excellent CORAL etch rates at relatively low temperatures.

EXAMPLE 15

Blanketed polysilicon was statically soaked in Formulations P-R at 30° C. for 30 minutes and the etch rate of the polysilicon determined. The results are summarized in Table 15 hereinbelow.

TABLE 15

Results of static soak of polysilicon in Formulations P-R.

| Formulation | PolySi etch rate/Å min$^{-1}$ |
|---|---|
| P | 0.3 |
| Q | 0.2 |
| R | 0.3 |

It can be seen that the etch rate of polysilicon in Formulations P-R was negligible at the temperature studied herein at extreme soaking conditions, e.g., a soak for 30 minutes. This suggests that Formulations P-R will not damage the underlying polysilicon material. In addition, because polysilicon should etch more rapidly that bare Si, it can be assumed that Formulations P-R will not damage bare Si either.

EXAMPLE 16

Bare Si substrates having a blanketed CORAL™ layer having a thickness of approximately 22,000±1,000 Å thereon were statically soaked in Formulations S-X for 3 min at 30° C. Following immersion for the specified time, the substrate was rinsed with DI water, dried, and the amount of CORAL™ removed and the etch rate determined using a Nanospec. The results are summarized in Table 16 hereinbelow.

TABLE 16

Results of static soak of CORAL ™ in Formulations S-X.

| Formulation | time | 30° C. total loss/Å | 30° C. etch rate/ Å min$^{-1}$ |
|---|---|---|---|
| S | 3 min | 22,183 | 7,394 |
| T | 3 min | 22,339 | 7,446 |
| U | 3 min | 22,123 | 7,374 |
| V | 3 min | 22,262 | 7,421 |
| W | 3 min | 22,344 | 7,448 |
| X | 3 min | 22,440 | 7,480 |

It can be concluded herein that Formulations S-X provide excellent CORAL etch rates at very low temperatures.

EXAMPLE 17

Blanketed polysilicon was statically soaked in Formulations S-X at 30° C. for 30 minutes and the etch rate of the polysilicon determined. The results are summarized in Table 17 hereinbelow.

TABLE 17

Results of static soak of polysilicon in Formulations S-X.

| Formulation | PolySi etch rate/Å min$^{-1}$ |
|---|---|
| S | 0.1 |
| T | 0.2 |
| U | 0.2 |
| V | 0.3 |
| W | 0.3 |
| X | 0.3 |

It can be seen that the etch rate of polysilicon in Formulations S-X was negligible at the temperature studied herein at extreme soaking conditions, e.g., a soak for 30 minutes. This suggests that Formulations S-X will not damage the underlying polysilicon material. In addition, because polysilicon should etch more rapidly that bare Si, it can be assumed that Formulations S-X will not damage bare Si either.

EXAMPLE 18

The pH of Formulation CC diluted 20:1 with DI water was determined to be 3.0.

Bare Si substrates having blanketed BD materials thereon (as described in Example 1) were statically soaked in concentrated Formulation CC for 1 min at 30° C. to 50° C. as indicated in Table 18. The results of the static soak are summarized in Table 18 hereinbelow, whereby a "yes" denotes that the specific BD material was substantially dissolved in the composition at the specified temperature at the specified time.

TABLE 18

Results of static soak of BD materials in diluted Formulation CC.

| | 30° C. | | | 40° C. | | | 50° C. | | |
|---|---|---|---|---|---|---|---|---|---|
| time | BDTM | BDD1 | BDD2 | BDTM | BDD1 | BDD2 | BDTM | BDD1 | BDD2 |
| 1 min | yes | yes | yes | yes | yes | yes | yes | yes | yes |

It can be seen that the BD materials were etched from the surface of the substrate and were not dependent on the process conditions evaluated, including time of soaking, the temperature, or the thickness of the BD material.

EXAMPLE 19

Blanketed polysilicon (initial thickness of approximately 970 Å) was statically soaked in Formulation CC for 30 minutes at various temperatures and the etch rate of the polysilicon determined. The results are summarized in Table 19 hereinbelow.

TABLE 19

Results of static soak of polysilicon in Formulation CC.

| temperature/° C. | PolySi etch rate/Å min$^{-1}$ |
|---|---|
| 30 | 0.96 |
| 40 | 0.99 |
| 50 | 1.83 |

It can be seen that the etch rate of polysilicon in Formulation CC was low in the temperature range studied under extreme soaking conditions, e.g., a soak for 30 minutes. This suggests that Formulation CC will not damage the underlying polysilicon material.

EXAMPLE 20

Samples of bare silicon, BDTM, BDD1, and BDD2 were statically soaked in Formulation CC for 15 minutes at 40° C. and/or 200 minutes at 60° C. to mimic extreme soaking conditions. Following immersion for the specified time, the samples were removed from the static soak bath, rinsed, dried and the Atomic Force Microscopic (AFM) surface roughness determined. The results are reported in Table 20 hereinbelow.

TABLE 20

Results of static soak of bare Si and BD materials in Formulation CC.

| | | control | Formulation A | | | |
|---|---|---|---|---|---|---|
| | Temperature | bare Si (nm) | bare Si (nm) | BDTM (nm) | BDD1 (nm) | BDD2 (nm) |
| 5 m scan | 40° C. | 0.145 | 0.144 | 0.204 | — | — |
| 5 m scan | 60° C. | 0.145 | 1.060 | 0.606 | 0.681 | 0.534 |

It can be seen that the bare Si substrate was not significantly damaged during the extreme soak of the respective substrates in Formulation CC. For example, the largest numerical change from 0.145 nm to 1.060 nm equates to negligible damage to the surface of the bare Si surface. These results suggest that Formulation CC will not damage the underlying bare Si substrate either.

EXAMPLE 21

The bath life of Formulation CC at 40° C. in an open and closed environment was evaluated, said bath life being greater than 48 hrs. A Si substrate having BDTM thereon was immersed in the formulation for 5 minutes and it was determined that the formulation effectively removed the BDTM from said substrate within 5 minutes.

Further, the results suggest that Formulation CC has a useful bath-life, regardless of whether the formulation became more concentrated over the course of two days (i.e., the open bottle wherein water evaporated over time). In addition, the formulation remained viable over the length of the experiment and continued to remove the BDTM from the Si substrate even after two days. Importantly, no solids were detected in the bottles after 48 hr at 40° C. or when the bottles were cooled to room temperature.

EXAMPLE 22

Silicon substrates having a blanketed CORAL™ layer having a thickness of approximately 22,000±1,000 Å thereon were statically soaked in Formulation CC for 2 min at 40° C. Following immersion for the specified time, the substrate was rinsed with DI water, dried, and the amount of CORAL™ removed and the etch rate determined using a Nanospec. It was determined that 22,042 Å of CORAL™ was removed and thus the etch rate was 11,021 Å min$^{-1}$. It can be concluded herein that Formulation CC provides excellent CORAL etch rates at relatively low temperatures.

EXAMPLE 23

A silicon substrate having a blanketed CORAL™ layer was statically soaked in Formulation CC for 200 minutes at 60° C. to mimic extreme soaking conditions. Following immersion, the sample was removed from the static soak bath, rinsed, dried and the Atomic Force Microscopic (AFM) surface roughness determined. The RMS roughness (5 μm scan) of the bare Si after processing was determined to be 0.845 nm.

EXAMPLE 24

Separate bare Si substrates having blanketed TEOS, silicon nitride, AURORA™, CORAL™, BLACK DIAMOND™, OSG, FSG, ultra low-k dielectric (ULK) or copper film layers thereon were statically soaked in Formulation CC at various temperatures. Following immersion for the specified time, the substrate was rinsed with DI water, dried, and the amount of film removed and the etch rate determined using a Nanospec. The results are summarized in Table 24 hereinbelow and illustrated in FIG. 1.

TABLE 24

Results of static soak of film layers in Formulation CC.

| Material | Etch Rate at 30° C./Å min$^{-1}$ | Etch Rate at 40° C./Å min$^{-1}$ | Etch Rate at 50° C./Å min$^{-1}$ | Etch Rate at 60° C./Å min$^{-1}$ |
|---|---|---|---|---|
| TEOS | 10,751 ± 1269 | 16,010 ± 508 | 19,394 ± 477 | 25,193 ± 445 |
| silicon nitride | 166 ± 3 | 319 ± 20 | 473 ± 19 | 755 ± 43 |
| AURORA ™ | 9,422 ± 127 | 10,612 ± 104 | 15,836 ± 164 | 27,797 ± 760 |
| CORAL ™ | 4,161 ± 214 | 12,177 ± 360 | 20,269 ± 1206 | 25,793 ± 797 |
| BLACK DIAMOND ™ | 13,038 ± 450 | 15,656 ± 430 | 19,497 ± 420 | 26,031 ± 490 |
| OSG | 6,498 ± 200 | 8,670 ± 180 | 12,401 ± 180 | 17,062 ± 150 |
| FSG | 20,928 ± 572 | 26,244 ± 3421 | 36,601 ± 823 | 49,596 ± 3400 |
| ULK | 41,548 ± 317 | — | — | — |
| copper | 1.4 ± 0.2 | 1.0 ± 0.4 | 0.1 ± 0.1 | 0.4 ± 0.6 |

It can be seen that Formulation CC efficiently removes the many low-k dielectric variations, with the overall efficiency dependent on the removal temperature chosen. Importantly, Formulation CC did not compromise copper materials that were exposed to said formulation.

EXAMPLE 25

Figure 2:
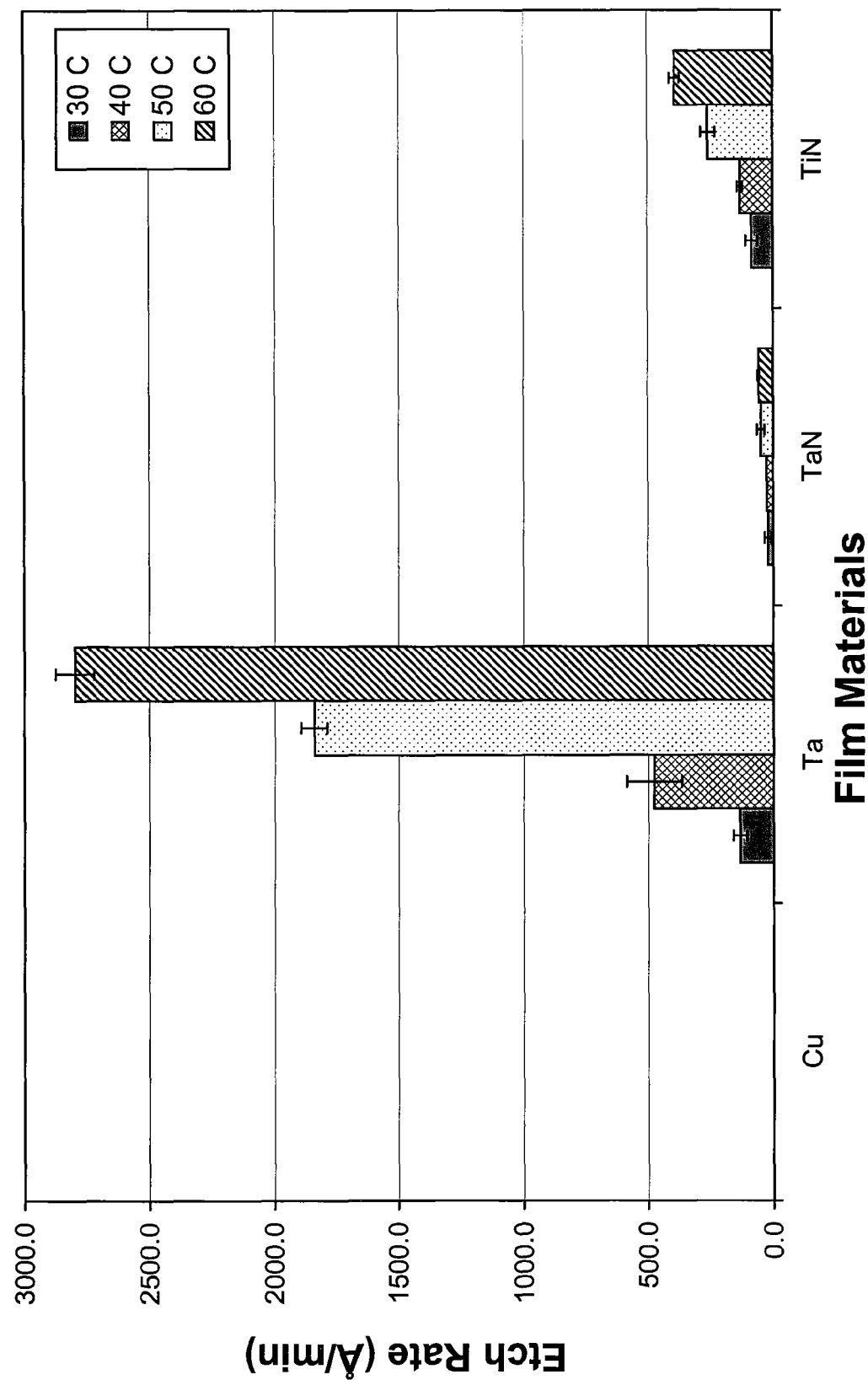
FIG. 2 is a plot of the etch rate, in Å min$^{-1}$, of various metal stack materials as a function of temperature.
Figure 3:
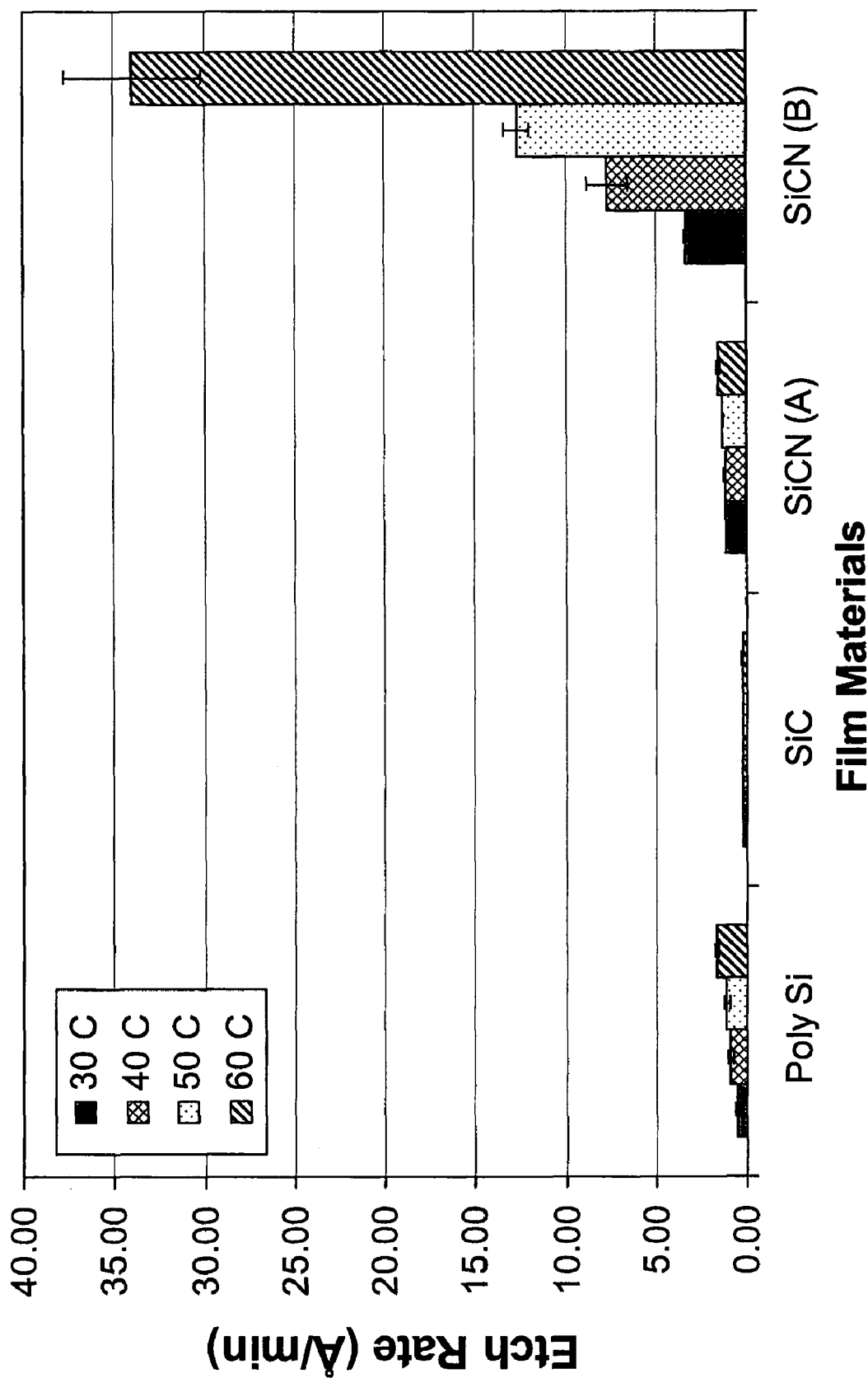
FIG. 3 is a plot of the etch rate, in Å min$^{-1}$, of various underlying silicon-containing materials as a function of temperature.

The etch rates of blanketed Ta, TaN, TiN, Cu, poly-Si, SiC, SiCN (A) and SiCN (B) (where SiCN (A) and SiCN (B) represent two different proprietary silicon carbinitride samples) were determined following static immersion of each sample in Formulation CC at temperatures ranging from 30° C. to 60° C. The etch rates were determined using a Nano-Spec. The results are reported in Table 25 and illustrated schematically in FIGS. 2 and 3.

TABLE 25

Results of static soak of film layers in Formulation CC.

| Material | ER at 30° C./Å min$^{-1}$ | ER at 40° C./Å min$^{-1}$ | ER at 50° C./Å min$^{-1}$ | ER at 60° C./Å min$^{-1}$ |
|---|---|---|---|---|
| Cu | 0 ± 0 | 0 ± 0 | 0 ± 0 | 0 ± 0 |
| Ta | 133 ± 27 | 476 ± 111 | 1839 ± 54 | 2798 ± 76 |
| TaN | 20 ± 13 | 26 ± 2 | 49 ± 15 | 57 ± 3 |
| TiN | 85 ± 23 | 130 ± 10 | 257 ± 28 | 391 ± 20 |
| poly-Si | 0.54 ± 0.08 | 0.90 ± 0.19 | 1.11 ± 0.14 | 1.67 ± 0.07 |
| SiC | 0.20 ± 0.03 | 0.20 ± 0.01 | 0.21 ± 0.02 | 0.26 ± 0.02 |
| SiCN (A) | 1.11 ± 0.02 | 1.19 ± 0.03 | 1.32 ± 0.05 | 1.58 ± 0.13 |
| SiCN (B) | 3.37 ± 0.09 | 7.64 ± 1.13 | 12.67 ± 0.67 | 33.98 ± 3.78 |

It can be seen that the Ta, TaN, and TiN metal stack materials can be removed using the formulation of the present invention, however, copper material was not readily removed at the temperatures investigated. To assist with the removal of copper layers, 40 g of Formulation CC was mixed with 4 g of 30% hydrogen peroxide and the low-k and metal stack materials immersed therein (see Formulation II herein). The etch rate of the low-k dielectric materials was unchanged following the inclusion of $H_2O_2$ in Formulation CC, however, the etch rate of the copper was immeasurable because the copper layer was etched so rapidly. In addition, the etch rate of the TiN was increased when immersed in Formulation II.

Regarding the SiCN etch rates in the presence of Formulation CC, it can be hypothesized that the oxygen content of the SiCN layers impacted the etch rate of the material. Although not wishing to be bound by theory, it is thought that the higher the oxygen content of the SiCN film, the more robust the film material and thus the lower the etch rate.

Samples of bare Si, SiC and SiCN (A) were further processed in Formulation CC at extreme static conditions (60° C. for 200 minutes), rinsed, dried and analyzed using AFM. It was determined that the processed wafers had low rms roughness and as such, bare Si, SiC and SiCN(A) were not significantly damaged in the presence of Formulation CC.

EXAMPLE 26

Three separate experiments were performed to demonstrate the advantages of neutralizing the removal composition present on the device wafer prior to rinsing said wafer in water.

The first experiment included cleaning a device wafer with Formulation CC for 3 minutes at 50° C. followed by rinsing said wafer in a deionized (DI) water bath for 1 min, wherein the volume of Formulation CC was the same as the volume of DI water in the rinse bath. The pH of the DI water was measured before and after the rinsing step. The pH of the DI water before the rinse step was 5.82 and the pH of the DI water subsequent to the rinse step was 2.98, demonstrating that the residue removal composition (i.e., formulation CC) significantly impacts the pH of the rinse solution (see also Table 26 hereinbelow).

The second experiment included immersion of the device wafer in formulation CC for 3 minutes at 50° C., followed by immersion of the device wafer in the neutralizing buffer bath for 1 minute, and lastly immersion in the DI water rinse bath for 1 minute. The neutralizing buffer bath had a pH of approximately 7 prior to immersion therein. Similarly to the first experiment, the volume of removal composition bath, neutralizing buffer bath and rinse bath is approximately the same. The pH of the DI water bath and the neutralizing buffer bath were measured before and after the rinse step. The results are reported in Table 26.

TABLE 26 pH of baths following immersion of device wafers therein.

| Experiment No. | Rinsing Solution | pH before rinse | pH after rinse |
|---|---|---|---|
| 1 | DI water | 5.82 | 2.98 |
| 2 | pH 7 buffer | 7 | 6.985 |
|   | DI water | 5.9 | 6.852 |
| 3 | pH 10 buffer | 10 | 9.907 |
|   | DI water | 5.91 | 8.704 |

It can be seen that the pH of the DI water bath in the second experiment actually increased following immersion of the device wafer having neutralized removal composition thereon.

The third experiment included immersion of the device wafer in formulation CC for 3 minutes at 50° C., followed by immersion of the device wafer in the neutralizing buffer bath for 1 minute, and lastly immersion in the DI water rinse bath for 1 minute. The neutralizing buffer bath had a pH of approximately 10. Similar to the first experiment, the volume of removal composition bath, neutralizing buffer bath and rinse bath is approximately the same. The pH of the DI water bath and the neutralizing buffer bath was measured before and after the rinse step and the results reported in Table 26. It can be seen that the pH of the DI water bath in the third experiment actually increased substantially following immersion of the device wafer having neutralized removal composition thereon.

Importantly, these experiments demonstrate that the fluoride source is readily neutralized using buffer baths and as such, the DI wastewater may be incinerated as discussed in the background of the invention. Advantageously, the buffer baths of the invention did not damage the underlying silicon-containing layers (e.g., bare Si, SiC, SiCN, polysilicon, etc.).

In order to investigate the effects of loading on the buffer bath, an experiment was performed whereby six samples were cleaned with removal composition, e.g., formulation CC, for 3 minutes at 50° C., followed by the immersion of the sample having removal composition thereon in the same pH 7 neutralizing bath, followed by the immersion of the sample having neutralized removal composition thereon in the same DI water rinse bath. The three-step experiment was serially performed six times. The results are reported in Table 27 hereinbelow.

TABLE 27 pH of DI water following serial immersion of six samples.

| Experiment No. | Rinsing Solution | pH before rinse | pH after rinse |
|---|---|---|---|
|   | buffer 7.0 | 7.003 |   |
|   | DI water | 5.933 |   |
| 1 | pH 7 buffer (step 1) |   | 6.973 |
|   | DI water (step 2) |   | 6.903 |
| 2 | pH 7 buffer (step 1) |   | 6.895 |
|   | DI water (step 2) |   | 6.903 |
| 3 | pH 7 buffer (step 1) |   | 6.882 |
|   | DI water (step 2) |   | 6.903 |
| 4 | pH 7 buffer (step 1) |   | 6.813 |
|   | DI water (step 2) |   | 6.894 |
| 5 | pH 7 buffer (step 1) |   | 6.74 |
|   | DI water (step 2) |   | 6.883 |
| 6 | pH 7 buffer (step 1) |   | 6.698 |
|   | DI water (step 2) |   | 6.885 |

It can be seen that the buffer bath aids in maintaining the DI water bath pH at about pH 7 even after multiple, serial rinsing steps.

EXAMPLE 27

Several different experiments were performed to formulate removal compositions that varied depending on the disposal requirements but still effectively removed low-k dielectric material from the microelectronic device without damaging the underlying silicon-containing substrate.

EXAMPLE 27A

Formulation CC was buffered with tetramethylammonium hydroxide (TMAH), or monoethylamine (MEA) and the resulting solutions had measured pH values of 6. Unfortunately, the solutions underwent phase separation and were discarded. Formulation CC was then buffered with triethylamine (TEA) to form a solution having a pH of 7.4 and a solution having a pH of 5.5. In both cases, the solutions including TEA remained in one phase and blanketed samples of CORAL®, BD and poly-Si were immersed in each solution at 50° C. and the etch rates of each determined using a NanoSpec. In each case, buffered formulation CC displayed an unacceptably fast etch rate of the underlying silicon-containing layer (Si damage was observed) and an unacceptably slow etch rate of the low-k dielectric material.

EXAMPLE 27B

The HF in Formulation CC was replaced with approximately 20 wt. % tetrabutylammonium fluoride (TBAH) or approximately 20 wt. % borofluoric acid. Blanketed samples of CORAL®, BD and poly-Si were immersed in each solution at 50° C. and the etch rates of each determined using a NanoSpec. It was concluded that in formulation CC, the best fluoride source remains HF.

EXAMPLE 27C

Hydroxide-based formulations having a pH of about 13.7 were investigated as an alternative to fluoride-based removal compositions. Blanketed samples of CORAL®, BD and poly-Si were immersed in each solution at 50° C. and the etch rates of each determined using a NanoSpec. It was concluded that acidic, fluoride-based formulations are superior to hydroxide-based formulations at removing low-k dielectric material from the surface of the microelectronic device.

EXAMPLE 27D

Formulation CC was diluted with water, diethylene glycol monobutyl ether (BC) or 1-phenoxy-2-propanol (PPh) in order to decrease the overall HF concentration (1 part formulation CC to x parts diluting solvent). These solutions would have the advantage of having low HF concentrations and as such, could be disposed of by incineration. Blanketed samples of CORAL®, BD and poly-Si were immersed in each solution at the specified temperature for the specified length of time and the etch rates of each determined using a NanoSpec. The results using the formulation diluted with water, BC and PPh are shown in Tables 28, 29 and 30, respectively.

TABLE 28

Etch rates in Å min$^{-1}$ of samples immersed in formulation diluted with water at 60° C.

| sample | Time/min | dilution ratio | ER/Å min$^{-1}$ |
|---|---|---|---|
| CORAL | 2 | 1:10 | 0 |
|  | 2 | 1:1 | 2365 |
| BD | 2 | 1:10 | residue remains |
|  | 2 | 1:1 | residue remains |
| poly-Si | 30 | 1:1 | 2.5 |

TABLE 29

Etch rates in Å min$^{-1}$ of samples immersed in formulation diluted with BC at 60° C.

| sample | Time/min | dilution ratio | ER/Å min$^{-1}$ |
|---|---|---|---|
| CORAL | 2 | 1:10 | 0 |
|  | 2 | 1:1 | 962 |
| BD | 2 | 1:10 | 0 |
|  | 2 | 1:1 | ~6500 |
| poly-Si | 30 | 1:1 | 1.6 |

TABLE 30

Etch rates in Å min$^{-1}$ of samples immersed in formulation diluted with PPh at 50° C.

| sample | Time/min | dilution ratio | ER/Å min$^{-1}$ |
|---|---|---|---|
| CORAL | 10 | 1:9 | 0 |
|  | 5 | 1:4 | 2457 |
|  | 3 | 1:2 | >7000 |
|  | 2 | 1:1 | 9884 |
| BD | 3 | 1:4 | ~6500 |
|  | 3 | 1:2 | ~6500 |
|  | 3 | 1:1 | ~6500 |
| poly-Si | 30 | 1:9 | 0.43 |
|  |  | 1:4 | 0.33 |
|  |  | 1:2 | 0.30 |
|  |  | 1:1 | 0.33 |

It can be seen that the underlying layer etch rate (poly-Si) in the formulation diluted with water is too high for the purposes of this invention. In addition, all formulations diluted at a ratio of 1:10 or 1:9 did not etch the low-k dielectric materials at an acceptable rate.

Importantly, the 1:1 and 1:2 dilutions with PPh both had an acceptable low-k dielectric etch rate and a negligible underlying silicon-containing layer etch rate. Advantageously, these compositions diluted with PPh have a much lower concentration of HF than formulation CC and as such, disposal issues are reduced.

EXAMPLE 27E

A three-step process of removing low-k dielectric material from the surface of a microelectronic device was investigated. BD wafers were immersed in a 20 wt. % HF solution for 1 min or 5 min at 50° C. In both cases, BD residue was visually observed on the wafer following immersion. Thereafter, the wafers were immersed in a 97.5 wt. % BC/2.5 wt. % sulfolane composition for 1 min or 5 min at 50° C. Again, BD residue was visually observed on the wafer. Thereafter the wafer was immersed in water, dried and the surface imaged using SEM. The micrographs clearly illustrated that BD residues remained on the surface of the wafer at the conclusion of the three-step process which indicates that the three-step process as described herein using the components of Formulation CC is not a viable option.

EXAMPLE 27F

Formulation DD represents a variation of Formulation CC having a lower organic solvent concentration and a higher fluoride concentration, so that the formulation had a lower COD count while still having a high low-k dielectric etch rate and a low underlying layer etch rate.

Blanketed samples of CORAL®, BD and poly-Si were immersed in formulation DD at 50° C. for the specified length of time and the etch rates of each determined using a Nano-Spec. The results are reported in Table 31 hereinbelow.

TABLE 31

Etch rates in Å min$^{-1}$ of samples immersed in formulation DD at 50° C.

| sample | Time/min | ER/Å min$^{-1}$ |
|---|---|---|
| CORAL | 1 | 21,973 |
| BD | 1 | >6400 |
| poly-Si | 30 | 0.47 |

It can be seen that Formulation DD provided a high low-k dielectric removal rate and a low poly-Si removal rate, and would be a viable option when high concentrations of HF are acceptable.

EXAMPLE 27G

Formulation EE represents a variation of Formulation DD having a lower fluoride concentration and the same organic solvent concentration, as introduced hereinbelow.

Blanketed samples of CORAL®, BD and poly-Si were immersed in formulation EE at various temperatures and the etch rates of each determined using a NanoSpec. The results are reported in Table 32 hereinbelow.

TABLE 32

Etch rates in Å min$^{-1}$ of samples immersed in formulation EE at various temperatures.

| sample | Temperature/° C. | ER/Å min$^{-1}$ |
|---|---|---|
| CORAL | 50 | 25,000 |
|  | 60 | 28,633 |
| BD | 30 | >2184 (cleared in 3 min) |
|  | 40 | >3214 (cleared in 2 min) |
|  | 50 | >6500 (cleared in 1 min) |
|  | 60 | >6500 (cleared in 1 min) |
| poly-Si | 30 | 0.64 (30 min) |
|  | 40 | 0.89 (30 min) |
|  | 50 | 0.93 (30 min) |
|  | 60 | 1.28 (30 min) |

It can be seen that Formulation EE provided a high low-k dielectric removal rate and a low poly-Si removal rate, and would be a viable formulation for the removal of low-k dielectric materials from microelectronic devices for recycling of same. Notably, formulation EE removes Ta and TiN after immersion for 10 min at 60° C., disadvantageously with delamination, but cannot dissolve TaN or Cu under the same conditions.

Samples of bare Si, and BD wafers were further processed in Formulation EE at extreme static conditions (60° C. for 200 minutes), rinsed, dried and analyzed using AFM. It was determined that the bare Si of the processed wafers was not significantly damaged by Formulation EE as demonstrated by the low rms surface roughness.

EXAMPLE 28

As seen in Example 27G, formulation EE can remove BD and CORAL without substantially damaging the underlying device substrate, e.g., poly-Si. That said, formulation EE does not readily remove metal films. As introduced hereinabove, oxidizing agents, such as hydrogen peroxide and nitric acid may be added to the formulations to enhance the concurrent removal of metal films from the surface of the device substrate without damaging said substrate. Formulations JJ and KK represents variations of formulation CC including oxidizing agents.

Blanketed samples of Cu (~1166 Å), TaN (~1600 Å), TiN (~1200 Å), Ta (~1200 Å), BD (~6400 Å) and CORAL® (~21000 Å) were immersed in formulation JJ at various temperatures for various lengths of time and the etch rates of each determined using a NanoSpec. The results are reported in Table 33 hereinbelow.

TABLE 33

Results of static soak of blanketed sample in Formulation JJ.

| Sample | time | 30° C. removed? | 30° C. etch rate/ Å min$^{-1}$ | 40° C. removed? | 40° C. etch rate/ Å min$^{-1}$ | 50° C. removed? | 50° C. etch rate/ Å min$^{-1}$ | 60° C. removed? | 60° C. etch rate/ Å min$^{-1}$ |
|---|---|---|---|---|---|---|---|---|---|
| Cu | 10 min | yes | >1,166 | yes | >1,166 | yes | >583 | yes | >389 |
|  | 5 min | yes |  | yes |  | yes |  | yes |  |
|  | 3 min | — |  | — |  | yes |  | yes |  |
|  | 1 min | yes |  | yes |  | no |  | no |  |
| TaN | 3 min | yes | >1,600 | yes | >1,600 | yes | >530 | yes | >530 |
|  | 1 min | yes |  | yes |  | no |  | no |  |
| TiN | 5 min | — | >1,200 | — | >1,200 | — | >400 | yes | >240 |
|  | 3 min | — |  | — |  | yes |  | no |  |
|  | 1 min | yes |  | yes |  | no |  | no |  |
| Ta | 1 min | yes | >1,200 | yes | >1,200 | yes | >400 | yes | >240 |
| BD | 5 min | — | >6,400 | — | >6,400 | — | >6,400 | yes | >6,400 |
|  | 3 min | — |  | — |  | yes |  | no |  |
|  | 1 min | yes |  | yes |  | some res |  | some res |  |
| CORAL | 5 min | — | >21,000 | — | >21,000 | — | >21,000 | yes | >21,000 |
|  | 3 min | — |  | — |  | yes |  | yes |  |
|  | 1 min | yes |  | yes |  | yes |  | some res |  |

It can be seen that formulation JJ readily removed the low-k and metal films within 1 minute at 60° C., however, for the Cu sample, re-deposition and/or precipitates were observed.

Importantly, the oxidizing agent may be introduced to the composition at the manufacturer, prior to introduction of the composition to the device wafer, or alternatively at the device wafer, i.e., in situ. It is further contemplated that in addition to oxidizing agent(s), other components may be added to the composition to dilute, maintain and/or increase the concentration of other components in the composition.

EXAMPLE 29

Based on the re-deposition results of Example 28, chelating agents were added to the formulations including oxidizing agents. Chelating agents contemplated herein include ethylenediaminetetraacetic acid (EDTA), (1,2-cyclohexylenedinitrilo)tetraacetic acid (CDTA), monoethanolamine (MEA), and acetylacetone (acac). In each case, the recited amount of each chelating agent was added to formulation JJ to form formulations LL through QQ, as introduced above, and blanketed samples of Cu, TaN, TiN, Ta, BD and CORAL® were immersed therein at various temperatures for various lengths of time and the etch rates of each determined using a NanoSpec.

With formulation LL, the CORAL, BD, Cu, TiN, Ta and TaN were all removed from the device substrate within 3 minutes at 50° C. Importantly, no metal precipitates were observed at the cross-section or backside of the device substrate. The etch rate of poly-Si was unmeasureable because of Poly-Si film delamination.

With formulations MM and NN, the CORAL, BD, Cu, TiN, Ta and TaN were all removed from the device substrate within 3 minutes at 50° C., however, metal precipitates were observed at the cross-section of the device substrate. The etch rate of poly-Si was determined to be 2 Å min$^{-1}$ and 2.1 Å min$^{-1}$ for formulations MM and NN, respectively.

With formulation OO, the CORAL, BD, Cu, TiN, Ta and TaN were all removed from the device substrate within 5 minutes at 50° C., and no metal precipitates were observed at the cross-section or backside of the device substrate. The etch rate of poly-Si was determined to be 2.1 Å min$^{-1}$.

With formulation PP, the CORAL, BD, Cu, TiN, Ta and TaN were all removed from the device substrate within 3 minutes at 50° C., however, metal precipitates were observed at the cross-section of the device substrate. The etch rate of poly-Si was determined to be about 3.2 Å min$^{-1}$ and the device surface was uneven.

Comparing the results, it can be seen that Formulation OO displayed the most favorable results whereby the low-k and metal materials were readily removed from the device substrate and no Cu re-deposition or precipitation was observed on the processed substrate. Importantly, separate tests relating to the addition of chelating agents to formulation EE (i.e., devoid of oxidizing agent) and the static immersion of blanketed Cu wafers therein revealed that the Cu would not dissolve in a composition including chelating agents but not oxidizing agents.

The combination of oxidizing agent and chelating agent was further investigated to confirm the prevention of Cu re-deposition in a hydrofluoric acid-based composition during the etching process of metal films and/or low-k dielectric materials. In each case, 0.2 wt. % of $CuCl_2$, $CuSO_4$, $Cu(NO_3)_2$ or $Cu(acac)_2$ was added to separate compositions including 10.04% HF, 10.8% butyl carbitol, 2.2% sulfolane and 76.76% water. A bare silicon wafer was statically immersed in each separate composition for 5 minutes at room temperature (RT) and 50° C., and 1% $H_2O_2$ and/or 0.5% CDTA were added, and the extent of copper residue thereon was observed. The results are reported in Table 34 hereinbelow.

TABLE 34

Precipitation of copper at the surface of a bare Si wafer in the presence of various additives

| additive? | formulation including $CuCl_2$ | formulation including $CuSO_4$ | formulation including $Cu(NO_3)_2$ | formulation including $Cu(acac)_2$ |
|---|---|---|---|---|
| none | Cu deposited on wafer at RT and 50° C. | Cu deposited on wafer at RT and 50° C. | Cu deposited on wafer at 50° C. and part of the wafer at RT | Cu deposited on wafer at 50° C. and part of the wafer at RT |
| 1% $H_2O_2$ | Cu deposited on wafer at RT and 50° C. | Cu deposited on wafer at 50° C. but no Cu (but some residual matter) on the wafer at RT | no Cu (but some residual matter) on the wafer at RT or 50° C. | no Cu (but some residual matter) on the wafer at RT or 50° C. |
| 0.5% CDTA[‡] | Cu deposited on wafer at RT and 50° C. | at RT and 50° C., red-brown precipitate observed on wafer; precipitate soluble in water | at RT and 50° C., red-brown precipitate observed on wafer; precipitate soluble in water | at RT and 50° C., red-brown precipitate observed on wafer; precipitate soluble in water |
| both 1% $H_2O_2$ and 0.5% CDTA | red-brown precipitates on wafer at both RT and 50° C.; precipitate soluble in water | no Cu or residues on wafer at RT; no Cu (but some residue) on wafer at 50° C. | at RT and 50° C., no Cu or residues on the wafer | at RT and 50° C., no Cu or residues on the wafer |

[‡]0.6% $CuCl_2$ instead of 0.5% $CuCl_2$.

It can be seen that when both the oxidizing agent and the chelating agent were present in the composition, no copper deposition at the bare Si wafer was observed using any of the copper-containing compositions. Importantly, the red-brown precipitates observed are not re-deposited copper compounds because they were readily soluble in water. In other words, redeposition of metals, e.g., copper, onto the device wafer is negligible using the compositions of the invention.

Furthermore, it was surprisingly discovered that when both the oxidizing agent and the chelating agent were present in the compositions of the invention, the composition had an extended shelf-life. For example, formulation QQ stored at room temperature for 49 days still removed ~5000 Å copper in 10 sec and a ~9000 Å three-layer film including copper/TaN/low-k in 1 minute. The same formulation stored at 40° C. for 35 days removed ~5000 Å copper in 10 sec and a ~9000 Å three-layer film including copper/TaN/low-k in 1 minute.

EXAMPLE 30

Blanketed samples of Cu (~1166 Å), TaN (~1600 Å), TiN (~1200 Å), Ta (~1200 Å), BD (~6400 Å) and CORAL® (~21000 Å) were immersed in formulations AA, EE or FF at 50° C. for 5 minutes and the etch rates (ER) of each determined using a NanoSpec. The results are reported in Table 35 hereinbelow.

It can be seen that Formulations AA, EE and FF attack the metal films and barrier layer materials. Importantly, when the concentration of HF and butyl carbitol is decreased (formulation FF), the etch rate of copper increased while the etch rate of TaN, Ta and TiN all decreased. As such, it is predicted that a composition having a low concentration of HF plus barrier layer inhibiting agents will reduce the etch rate of the barrier layer materials, especially Ta and TiN.

In order to further decrease the etch rate of Ta and TiN, the concentration of HF, butyl carbitol and NMMO was varied and some metal inhibitors added. It was determined that lowering the concentration of HF and/or adding inhibitors such as polyacrylic acid and 1,2,4-triazole decreased the etch rate of Ta while the concentration of NMMO was the determining factor to lowering the etch rate of TiN. Importantly, however, there is a minimum concentration of HF of about 10 wt. % below which the BD and CORAL may not dissolve completely at process conditions of 50° C. for 5 minutes.

It is noted that formulation AA is an HAP-free formulation.

EXAMPLE 31

Blanketed samples of BD and poly-Si were immersed in each solution for 30 minutes at 60° C. and the etch rates of each determined using a NanoSpec. It was determined that the BD dissolved in both Formulations GG and HH in less

TABLE 35

| formulation | BD | CORAL | Cu | TaN | Ta | TiN |
|---|---|---|---|---|---|---|
| AA | delamination; residue on wafer | delamination; residue on wafer | ER = 2 Å $min^{-1}$ | ER = 27 Å $min^{-1}$ | film partially dissolved; residue on wafer | ER = 74 Å $min^{-1}$; film delaminated unevenly |
| EE | removed within 2 min | removed within 2 min | ER = 3 Å $min^{-1}$ | ER = 18 Å $min^{-1}$ | ER > 276 Å $min^{-1}$; removed in 5 min | ER = 98 Å $min^{-1}$; film delaminated unevenly |
| FF | removed within 5 min | removed within 5 min | ER = 15 Å $min^{-1}$ | ER = 15 Å $min^{-1}$ | partially dissolved | ER = 55 Å $min^{-1}$; film delaminated unevenly | than 1 min at 60° C. and that the poly-Si etch rate in Formulations GG and HH were 1.42 Å min$^{-1}$ and 0.54 Å min$^{-1}$, respectively.

Accordingly, while the invention has been described herein in reference to specific aspects, features and illustrative embodiments of the invention, it will be appreciated that the utility of the invention is not thus limited, but rather extends to and encompasses numerous other aspects, features, and embodiments. Accordingly, the claims hereafter set forth are intended to be correspondingly broadly construed, as including all such aspects, features, and embodiments, within their spirit and scope.

What is claimed is:

1. A removal composition, comprising hydrofluoric acid, at least one organic solvent, at least one chelating agent, and water,
   wherein the composition comprises less than 1 wt. % amine species and greater than 10 wt % hydrofluoric acid, based on the total weight of said composition, and wherein said chelating agent comprises a species selected from the group consisting of acac, hfac, tfac, bis(trimethylsilylamide) tetramer, glycine, alanine, succinic acid, malonic acid, nitrilotriacetic acid, iminodiacetic acid, EDTA, CDTA, and combinations thereof.

2. The removal composition of claim 1, further comprising at least one additional species selected from the group consisting of at least one oxidizing agent, at least one additional acid, at least one surfactant, and combinations thereof.

3. The removal composition of claim 1, wherein the at least one organic solvent comprises a species selected from the group consisting of alcohols, ethers, pyrrolidinones, glycols, sulfur-containing solvents, glycol ethers, carboxylic acids, and combinations thereof.

4. The removal composition of claim 1, further comprising material dissolved therein, wherein said material is selected from the group consisting of low-k dielectric material, metal stack material, and combinations thereof.

5. The removal composition of claim 1, wherein the composition comprises HF, water, tetramethylene sulfone, and at least one glycol ether.

6. The removal composition of claim 1, wherein the amount of water is less than 80 wt. %, based on the total weight of the composition.

7. The removal composition of claim 1, wherein said chelating agent comprises a species selected from the group consisting of glycine, alanine, nitrilotriacetic acid, iminodiacetic acid, EDTA, CDTA, and combinations thereof.

8. The removal composition of claim 2, comprising oxidizing agent, wherein said oxidizing agent comprises a species selected from the group consisting of hydrogen peroxide, oxone, oxone tetrabutylammonium salt, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, sodium persulfate, potassium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, peracetic acid, and combinations thereof.

9. The removal composition of claim 2, wherein said composition comprises HF, water, sulfolane, CDTA, hydrogen peroxide, and diethylene glycol butyl ether.

10. The removal composition of claim 1, wherein the pH of a 20:1 dilution of the removal composition in water is in a range from about 2.5 to about 4.5.

11. A kit comprising, in one or more containers, one or more of the following reagents for forming a removal composition, wherein said removal composition comprises hydrofluoric acid, at least one organic solvent, and at least one chelating agent, wherein the composition comprises less than 1 wt. % amine species and greater than 10 wt % hydrofluoric acid, based on the total weight of said composition, wherein said chelating agent comprises a species selected from the group consisting of acac, hfac, tfac, bis(trimethylsilylamide) tetramer, glycine, alanine, succinic acid, malonic acid, nitrilotriacetic acid, iminodiacetic acid, EDTA, CDTA, and combinations thereof, and wherein the kit is adapted to form a removal composition suitable for removing material selected from the group consisting of low-k dielectric material, etch stop material, metal stack material, and combinations thereof from a microelectronic device having said material thereon.

12. A method of removing material from a microelectronic device having said material thereon, said method comprising contacting a microelectronic device structure with a removal composition for sufficient time to at least partially remove material selected from the group consisting of low-k dielectric material, etch stop material, metal stack material, and combinations thereof, from the microelectronic device structure, wherein the removal composition includes hydrofluoric acid, at least one organic solvent, at least one chelating agent, and water, wherein the composition comprises less than 1 wt. % amine species and greater than 10 wt % hydrofluoric acid, based on the total weight of said composition, and wherein said chelating agent comprises a species selected from the group consisting of acac, hfac, tfac, bis(trimethylsilylamide) tetramer, glycine, alanine, succinic acid, malonic acid, nitrilotriacetic acid, iminodiacetic acid, EDTA, CDTA, and combinations thereof.

13. The method of claim 12, wherein said contacting comprises conditions selected from the group consisting of time of from about 30 seconds to about 60 minutes; temperature in a range of from about 20° C. to about 90° C.; and combinations thereof.

14. The method of claim 12, further comprising at least one additional species selected from the group consisting of at least one oxidizing agent, at least one additional acid, at least one surfactant, and combinations thereof.

15. The method of claim 12, wherein the at least one organic solvent comprises a compound selected from the group consisting of methanol, ethanol, isopropanol, butanol, diols, triols, 2,2,3,3,4,4,5,5-octafluoro-1-pentanol, 1H,1H,9H-perfluoro-1-nonanol, perfluoroheptanoic acid, 1H,1H,7H-dodecafluoro-1-heptanol, perfluoropentanoic acid, 1H,1H,8H,8H-dodecafluoro-1,8-octanediol, 2,2,3,3,4,4,5,5-octafluoro-1,6-hexanediol, 5H-perfluoropentanoic acid, n-butyl heptafluorobutyrate, tetrahydrofuran (THF), N-methylpyrrolidinone (NMP), cyclohexylpyrrolidinone, N-otylpyrrolidinone, N-phenylpyrrolidinone, methyl formate, dimethyl formamide (DMF), dimethylsulfoxide (DMSO), tetramethylene sulfone (sulfolane), diethyl ether, phenoxy-2-propanol (PPh), propriopheneone, ethyl lactate, ethyl acetate, ethyl benzoate, acetonitrile, acetone, ethylene glycol, propylene glycol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether, tripropylene glycol methyl ether, dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof.

16. The method of claim 12, further comprising material dissolved therein, wherein said material is selected from the group consisting of low-k dielectric material, metal stack material, and combinations thereof.

17. The method of claim 16, wherein the low-k dielectric material comprises dielectric material selected from the group consisting of silicon-containing organic polymers, silicon-containing hybrid organic materials, silicon-containing hybrid inorganic materials, organosilicate glass (OSG), TEOS, fluorinated silicate glass (FSG), silicon nitride, and carbon-doped oxide (CDO) glass;
   wherein the etch stop material comprise a material selected from the group consisting of silicon carbide (SiC), silicon carbon nitride (SiCN), silicon carbon oxide (SiCO), silicon oxynitride (SiON), copper, silicon germanium (SiGe), SiGeB, SiGeC, AlAs, InGaP, InP, InGaAs, and combinations thereof; and
   wherein the metal stack material comprises a material selected from the group consisting of tantalum, tantalum nitride, titanium nitride, titanium, nickel, cobalt, tungsten, and silicides thereof; copper; aluminum; Al/Cu; alloys of Al; alloys of Cu; hafnium oxides; hafnium oxysilicates; zirconium oxides; lanthanide oxides; titanates; and combinations thereof.

18. The method of claim 12, wherein said chelating agent comprises a species selected from the group consisting of glycine, alanine, nitrilotriacetic acid, iminodiacetic acid, EDTA, CDTA, and combinations thereof.

19. The method of claim 14, comprising oxidizing agent, wherein said oxidizing agent comprises a species selected from the group consisting of hydrogen peroxide, oxone, oxone tetrabutylammonium salt, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, sodium persulfate, potassium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, peracetic acid, and combinations thereof.

20. The method of claim 12, further comprising rinsing the microelectronic device with deionized water following contact with the removal composition.

21. The method of claim 12, further comprising reusing the microelectronic device, subsequent to at least partial removal of said low-k dielectric material therefrom, in another multilayer microelectronic device manufacturing process.

22. The method of claim 12, further comprising incorporating the microelectronic device structure into the microelectronic device.

23. The method of claim 12, wherein the pH of a 20:1 dilution of the removal composition in water is in a range from about 2.5 to about 4.5.

* * * * *